(12) United States Patent
Lin et al.

(10) Patent No.: US 12,120,968 B2
(45) Date of Patent: Oct. 15, 2024

(54) SEMICONDUCTOR DEVICE, MEMORY CELL INCLUDING CONNECTING STRUCTURE HAVING BASE PORTION AND PILLAR PORTION, AND METHOD OF FORMING THE SAME

(71) Applicant: Taiwan Semiconductor Manufacturing Company, Ltd., Hsinchu (TW)

(72) Inventors: Yu-Chao Lin, Hsinchu (TW); Yuan-Tien Tu, Chiayi County (TW); Jung-Piao Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 323 days.

(21) Appl. No.: 17/458,581

(22) Filed: Aug. 27, 2021

(65) Prior Publication Data

US 2023/0065500 A1     Mar. 2, 2023

(51) Int. Cl.
    *H10N 70/00*        (2023.01)
    *H01L 23/528*     (2006.01)
    *H10B 63/00*      (2023.01)

(52) U.S. Cl.
    CPC ....... *H10N 70/841* (2023.02); *H01L 23/5283* (2013.01); *H10B 63/24* (2023.02); *H10N 70/063* (2023.02); *H10N 70/8265* (2023.02)

(58) Field of Classification Search
    CPC ... H10B 63/20–24; H10N 70/20–8845; H10N 70/841–8418
See application file for complete search history.

(56) References Cited

U.S. PATENT DOCUMENTS

2020/0273910 A1*    8/2020   Wu ........................ H10N 50/01

\* cited by examiner

*Primary Examiner* — Laura M Menz
*Assistant Examiner* — Candice Chan
(74) *Attorney, Agent, or Firm* — JCIPRNET

(57) ABSTRACT

A memory cell includes a bottom electrode, a memory element, a selector, a top electrode and a connecting structure. The memory element is disposed on the bottom electrode. The selector is disposed on the memory element. The top electrode is disposed on the selector. The connecting structure is electrically connecting the memory element to the selector, wherein the connecting structure includes a base portion and a pillar portion. The base portion disposed on the memory element. The pillar portion is disposed on the base portion, wherein the pillar portion is physically connected to the selector, and includes a tapered pillar foot.

20 Claims, 17 Drawing Sheets

SEMICONDUCTOR DEVICE, MEMORY CELL INCLUDING CONNECTING STRUCTURE HAVING BASE PORTION AND PILLAR PORTION, AND METHOD OF FORMING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density and higher numbers of semiconductor electronic components (e.g., transistors used for logic processing and memories used for storing information) of ever decreasing device dimensions. For example, the memories include non-volatile memory devices, where the non-volatile memory devices are capable of retaining data even after power is cut off. The non-volatile memory devices include resistive random-access memories and/or phase change random access memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
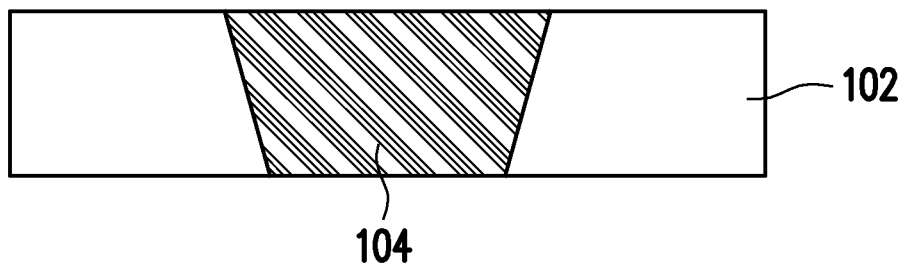
FIG. 1 to FIG. 12 are schematic sectional views of various stages in a method of forming a memory cell in accordance with some embodiments of the present disclosure

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a method of forming a memory cell which includes forming a selector on a memory element (or device). In a memory cell implemented with a selector (e.g., an ovonic threshold switch (OTS)), the selector is electrically connected to a corresponding memory element, so as to control the corresponding memory element. Conventionally, the memory element is connected to the selector through a connecting structure having a conductive pillar. The conductive pillar may be formed by patterning (or etching) a connecting material to form the conductive pillar, or may be formed through deposition techniques by filling a connecting material into openings of a dielectric layer to define the conductive pillar.

However, in the conventional methods, the patterning (or etching) of the connecting material usually results in a sharped triangular profile due to poor etching selectivity, and the resulting conductive pillar will have poor reliability in establishing an electrical connection between the memory element to the selector. Alternatively, if the conductive pillar is formed by deposition techniques, due to the difficulty in filling the connecting material in a small gap or opening of the dielectric layer, the dimensions of the formed conductive pillar are usually too big, or will have a poor profile due to insufficient material filling. As such, the connection between the selector and the memory element is highly unsecured, thereby causing the difficulty in the manufacture and the device yield.

In accordance with some embodiments discussed herein, the connection between the selector and the memory element is securely arrived by using a patterning method that forms a connecting structure with a pillar portion having higher structural integrity and improved profile. As such, the connection between the selector and the memory element is ensured, and the issues caused by the conventional conductive pillar can be resolved.

FIG. 1 to FIG. 12 are cross-sectional views of a method of forming a memory cell in accordance with some embodiments of the disclosure. In some embodiments, the memory cell is applied to a resistive random-access memory (RRAM) cell, hereinafter referred to as a RRAM cell as illustrated in FIG. 1 through FIG. 12. The RRAM cell may include one or more than one RRAM element or device.

Referring to FIG. 1, a bottom electrode 104 is provided. For example, the bottom electrode 104 is embedded in a dielectric layer 102. In some embodiments, the dielectric layer 102 includes a dielectric material, such as silicon oxide, silicon nitride, silicon oxynitride, silicon carbonitride, silicon carbide oxynitride, spin-on glass (SOG), phosphosilicate glass (PSG), borophosphosilicate glass (BPSG), fluosilicate glass (FSG), carbon doped silicon oxide (e.g., SiCOH), polyimide, a spin-on dielectric material, a low-k dielectric material, or the like, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof.

In some embodiment, the dielectric layer 102 is formed by chemical vapor deposition (CVD) (e.g., flowable chemical vapor deposition (FCVD), plasma-enhanced chemical vapor deposition (PECVD), high density plasma CVD (HDPCVD) or sub-atmospheric CVD (SACVD)), molecular layer deposition (MLD), spin-on, sputtering, or other suitable methods. In one embodiment, the dielectric layer 102 is a one-layer structure. In some other embodiments, the dielectric layer 102 is a multi-layer structure. The disclosure is not limited thereto. In some embodiments, the dielectric layer 102 serves as an insulating layer, and may be referred as an inter-metal dielectric (IMD) layer.

As illustrated in FIG. 1, the bottom electrode 104 is formed in the dielectric layer 102 by a single damascene process. For example, an opening (not shown) is formed in the dielectric layer 102, and the opening is filled with a conductive material. Thereafter, a planarization process (e.g., a chemical-mechanical planarization (CMP) process) is performed to remove excessive conductive material, thereby forming the bottom electrode 104. In some embodiments, the surface of the bottom electrode 104 is exposed from a top surface of the dielectric layer 102. In certain embodiments, a top surface of the bottom electrode 104 is substantially coplanar with the top surface of the dielectric layer 102 after the planarization process.

In some embodiments, the bottom electrode 104 is electrically coupled to an overlying structure (e.g. coupled to a first conductive layer of a memory element formed in subsequent steps). In certain embodiments, the bottom electrode 104 is configured to transmit the voltage applied to the bottom electrode 104 to a memory element located thereon. The bottom electrode 104 may be a single-layer structure (of one material) or a multilayer structure (of two or more different structure), and may be formed using CVD, atomic layer deposition (ALD), physical vapor deposition (PVD), a combination thereof, or the like. A material of the bottom electrode 104, for example, includes aluminum (Al), Copper (Cu), tungsten (W), some other low resistance material, or a combination thereof. The bottom electrode 104 may have a round, square, or rectangular profile from a top view.

In some alternative embodiments, a barrier layer (not shown) is optionally formed between the bottom electrode 104 and the dielectric layer 102. For example, the barrier layer is located at the sidewalls of the bottom electrode 104 to physically separate the bottom electrode 104 and the dielectric layer 102. In some embodiments, the barrier layer includes a material to prevent the bottom electrode 104 from diffusing to the adjacent layers. The material of the barrier layer may include Ti, Ta, TiN, TaN, or other suitable material, and may be formed using CVD, ALD, PVD, a combination thereof, or the like. Furthermore, the barrier layer has a material different from that of the bottom electrode 104. For example, in one embodiment, the barrier layer includes TaN while the bottom electrode 104 includes TiN.

Figure 2:
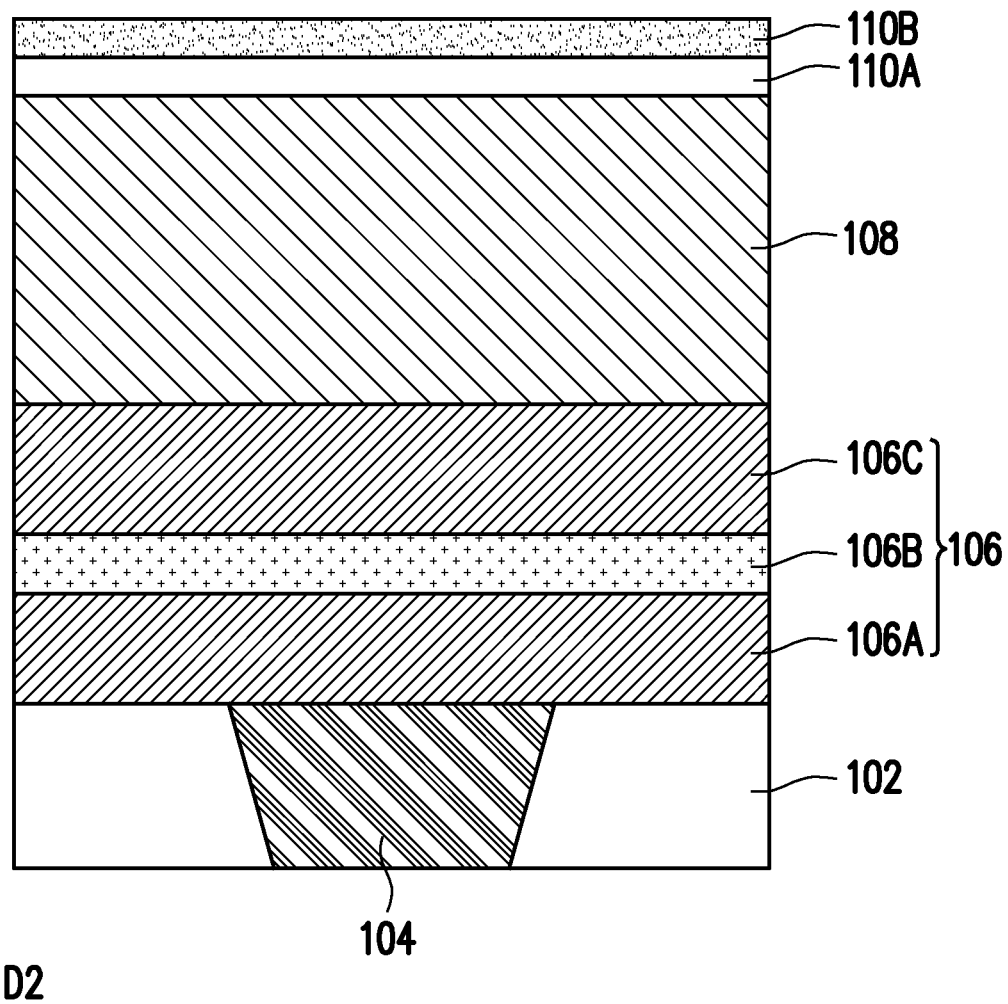
Figure 11:
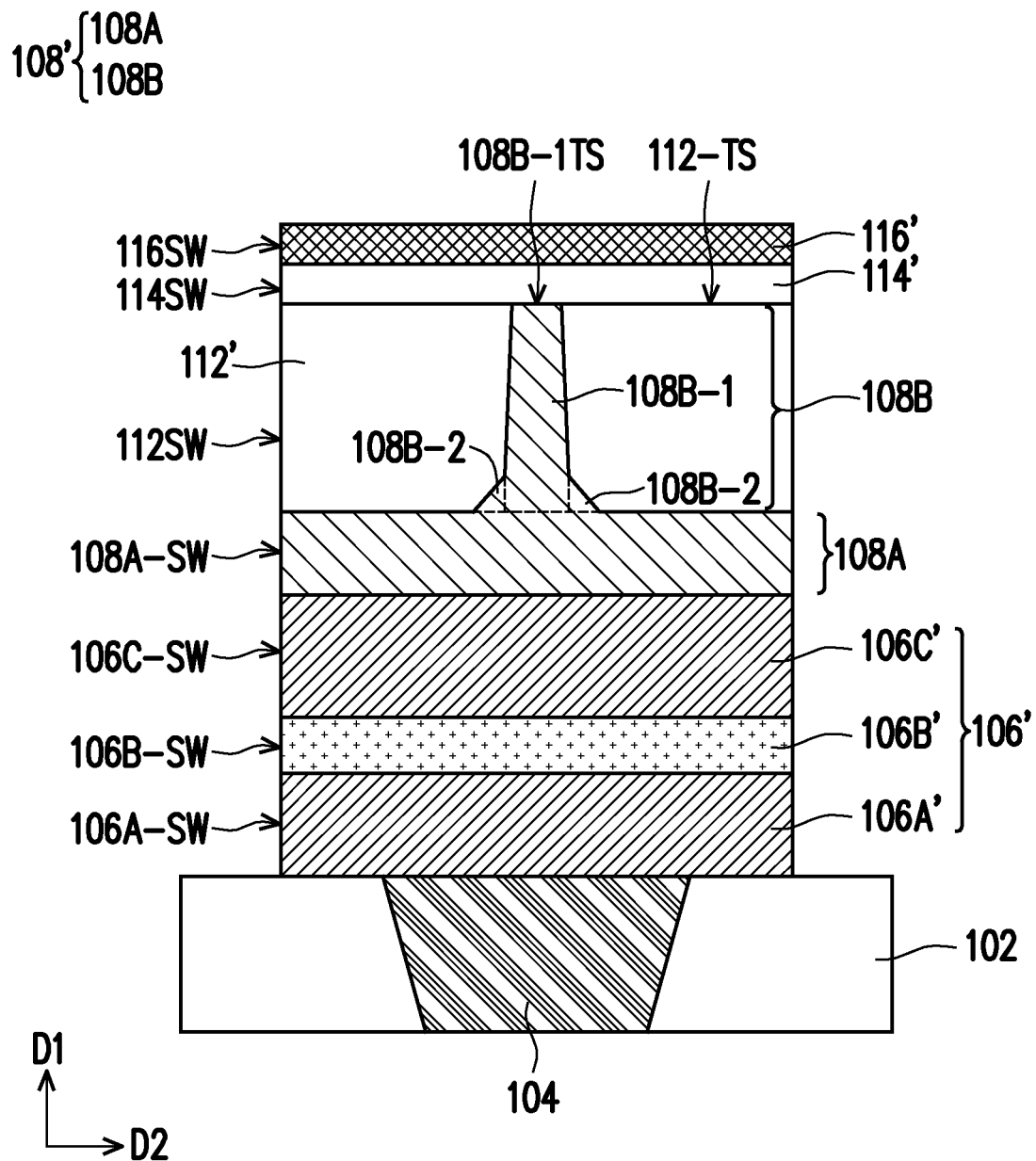

After forming the dielectric layer 102 and the bottom electrode 104, various steps of forming a memory element 106' and a connecting structure 108' (as illustrated in FIG. 11) on the bottom electrode 104 will be described. Referring to FIG. 2, a memory material stack 106, a connecting material 108, a first mask layer 110A (hard mask) and a second mask layer 110B (hard mask) are sequentially formed over the dielectric layer 102 and the bottom electrode 104 along a first direction D1 (e.g. a build-up direction). In other words, the memory material stack 106, the connecting material 108, the first mask layer 110A and the second mask layer 110B are stacked up along the first direction D1, and are extending along a second direction D2. The second direction D2 is perpendicular to the first direction D1.

In some embodiments, forming the memory material stack 106 includes sequentially forming a conductive material 106A, a storage element material 106B and a conductive material 106C over the dielectric layer 102 and the bottom electrode 104. For example, the conductive material 106A is conformally formed on the dielectric layer 102 and the bottom electrode 104. In some embodiments, the conductive material 106A is located in between the dielectric layer 102 and the storage element material 106B, and also located in between the bottom electrode 104 and the storage element material 106B. In some embodiments, the conductive material 106A is in physical contact with the bottom electrode 104. That is, the conductive material 106A is electrically connected to the bottom electrode 104. The conductive material 106A may include a conductive material, such as Ti, Co, Cu, AlCu, W, TiN, TiW, TiAl, TiAlN, TaN, Pt, or a combination thereof, and may be formed by any suitable method, such as CVD, PVD, or the like. In some embodiments, the conductive material 106A has a thickness of about 20 nm to about 50 nm.

In some embodiments, the storage element material 106B is conformally formed on and is connected to the conductive material 106A. For example, the storage element material 106B is in physical contact with the conductive material 106A. The storage element material 106B is located in between the conductive material 106A and the conductive material 106C. The storage element material 106B may be formed by any suitable method, such as PVD, ALD, or the like. In some embodiments, the storage element material 106B includes a variable resistance dielectric material (also referred to as a resistance changeable material) used for the RRAM element or device. For example, the variable resistance dielectric material includes a transition metal oxide material, such as hafnium oxide (such as HfO or $HfO_2$, etc.), niobium oxide $(NbO)_x$, lanthanum oxide $(LaO)_x$, gadolinium oxide $(GdO)_x$, vanadium oxide $(VO)_x$, yttrium oxide $(YO)_x$, zirconium oxide $(ZrO)_x$, titanium oxide $(TiO)_x$, tantalum oxide $(TaO)_x$, nickel oxide $(NiO)_x$, tungsten oxide $(WO)_x$, chromium oxide $(CrO)_x$, copper oxide $(CuO)_x$, cobalt oxide $(CoO)_x$ or iron oxide $(FeO)_x$, and combination thereof. The storage element material 106B may have a thickness of about 1 nm to about 10 nm.

In some embodiments, the conductive material 106C is conformally formed on the storage element material 106B. For example, the conductive material 106C is connected to the storage element material 106B. The conductive material 106C, for example, includes a conductive material, such as Ti, Co, Cu, AlCu, W, TiN, TiW, TiAl, TiAlN, TaN, Pt, or a combination thereof. In one embodiment, the materials of the conductive material 106C and the conductive material 106A are the same. For example, the conductive material 106C and the conductive material 106A both include TiN. In an alternative embodiment, the materials of the conductive material 106A and the conductive material 106C are different. The conductive material 106C may be formed by any suitable method, such as CVD, PVD, or the like. In some embodiments, the conductive material 106C has a thickness of about 20 nm to about 50 nm.

In some embodiments, an adhesive layer (not shown) is optionally formed between the conductive material 106C and the storage element material 106B to enhance the adhesion between the conductive material 106C and the storage element material 106B. Owing to the adhesive layer, a delamination at the interface of the conductive material 106C and the storage element material 106B can be prevented. The adhesive layer may be made of a transition metal, such as Ti, Ni, Hf, Nb, La, Y, Gd, Zr, Co, Fe, Cu, V, Ta, W, Cr, and combinations thereof, and may be formed by CVD or the like. For example, the adhesive layer includes Ti while the conductive material 106C includes TiN. In the disclosure, the material of the adhesive layer may be selected based on the materials of the layers located underlying and overlying thereto. In some embodiments, the adhesive layer has a thickness of about 10 nm to about 50 nm. Alternatively, with the sufficient adhesion between the conductive material 106C and the storage element material 106B that is capable of preventing the delamination therebetween, the adhesive layer may be optional, the disclosure is not limited thereto.

As further illustrated in FIG. 2, in some embodiments, the connecting material 108 is formed on the conductive material 106C of the memory material stack 106. For example, the connecting material is in physical contact with and electrically connected to the conductive material 106C of the memory material stack 106. The connecting material 108, for example, includes a conductive material, such as W, Ti, Co, Cu, AlCu, TiN, TiW, TiAl, TiAlN, TaN, Pt, or a combination thereof. The connecting material 108 may be formed by any suitable method, such as CVD, PVD, or the like. In some embodiments, the connecting material 108 has a thickness of about 100 nm to about 200 nm. In one embodiment, the material of the connecting material 108 is different from the material of the conductive material 106A and/or the material of the conductive material 106C. For example, the connecting material 108 includes W. As shown in FIG. 2, the dielectric layer 102 and the bottom electrode 104 are completely covered by the memory material stack 106 and the connecting material 108.

In a subsequent step, the first mask layer 110A and the second mask layer 110B are disposed over the connecting material 108. For example, the first mask layer 110A is disposed in between the connecting material 108 and the second mask layer 110B, and is in physical contact with the connecting material 108 and the second mask layer 110B. In some embodiments, a material of the first mask layer 110A is different from a material of the second mask layer 110B. For instance, in one embodiment, the first mask layer 110A includes TiN, while the second mask layer 110B includes a high-k material such as HfO$_2$. Furthermore, the first mask layer 110A and the second mask layer 110B may be formed by any suitable methods, such as CVD, PVD, ALD or the like.

Figure 4:
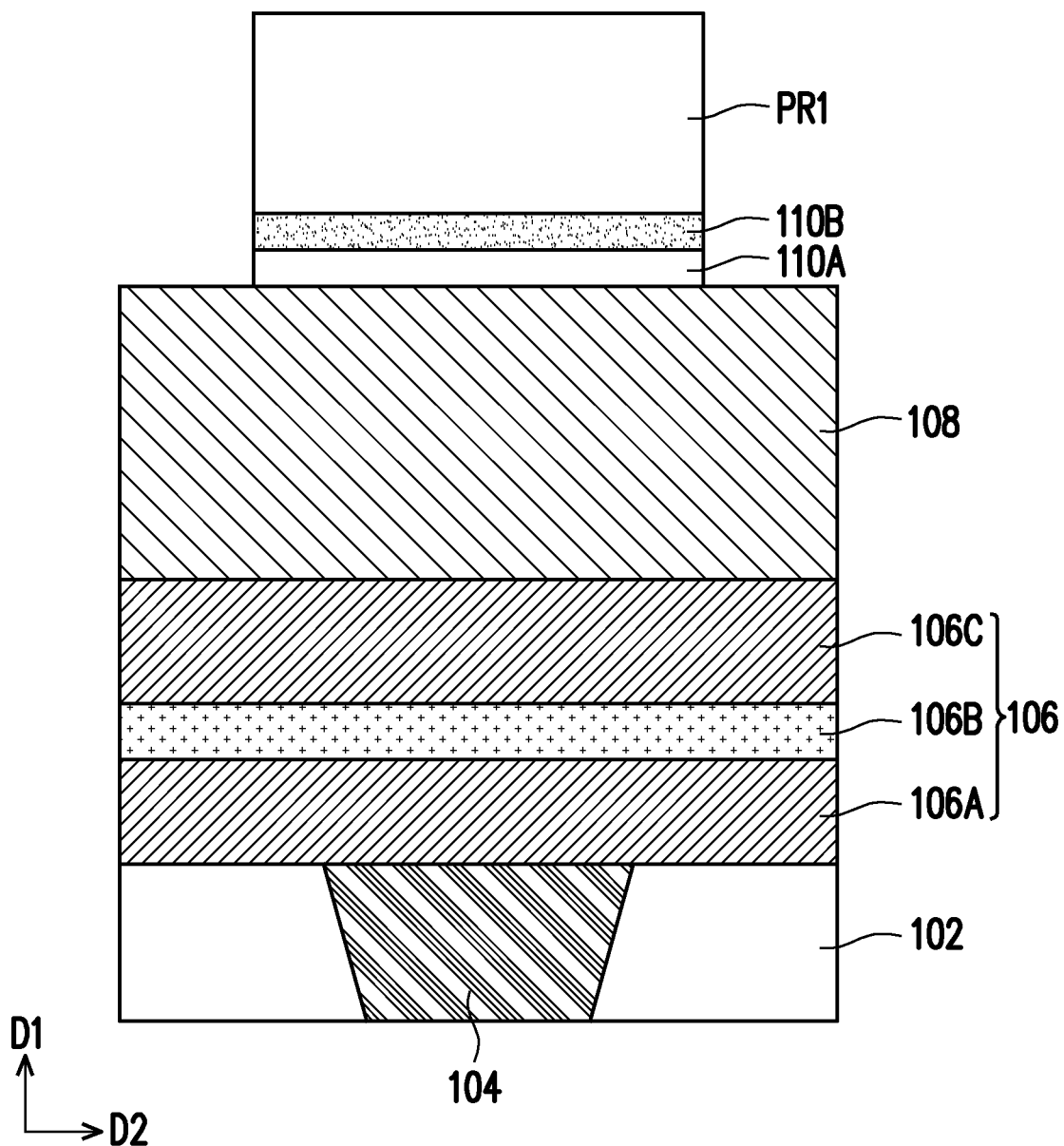
Figure 5:
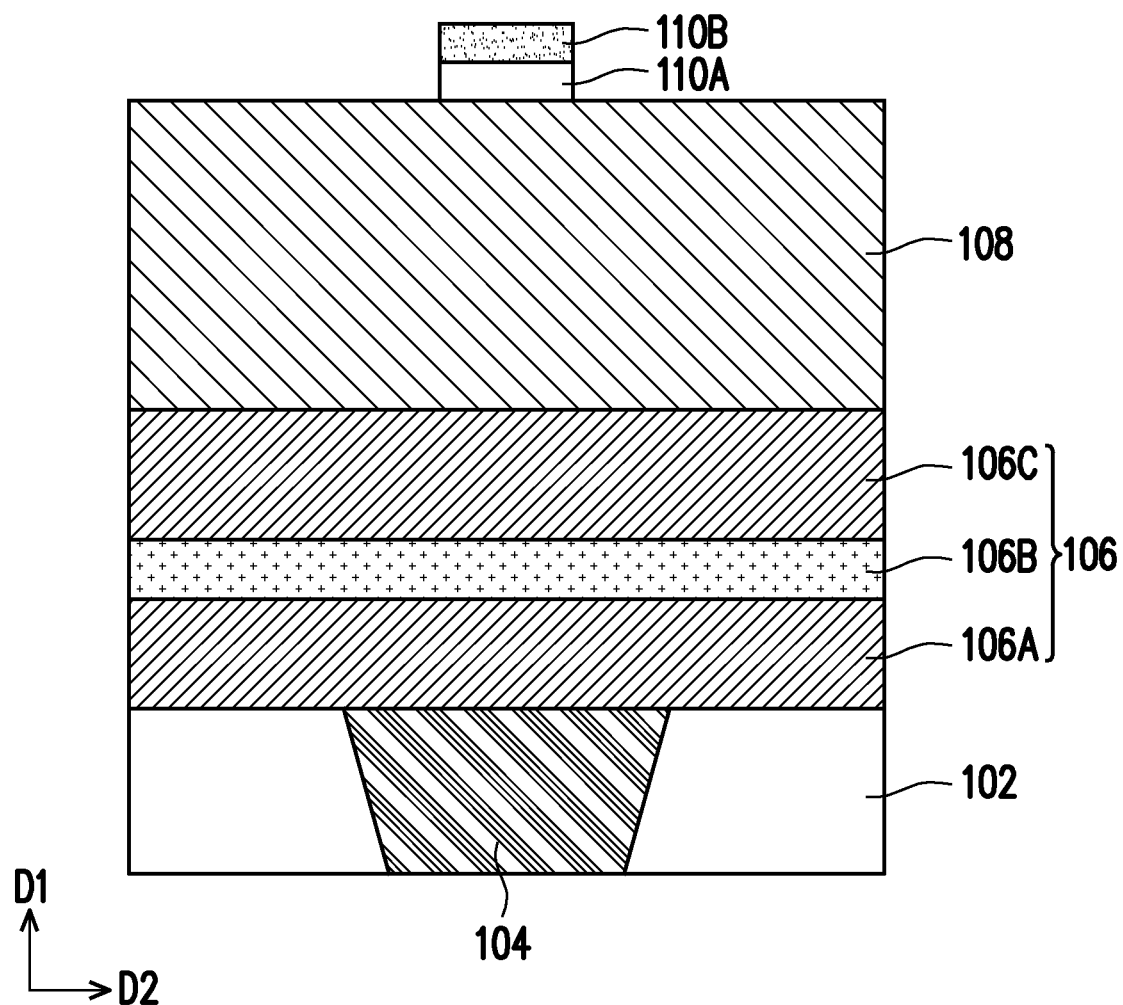
Figure 6:
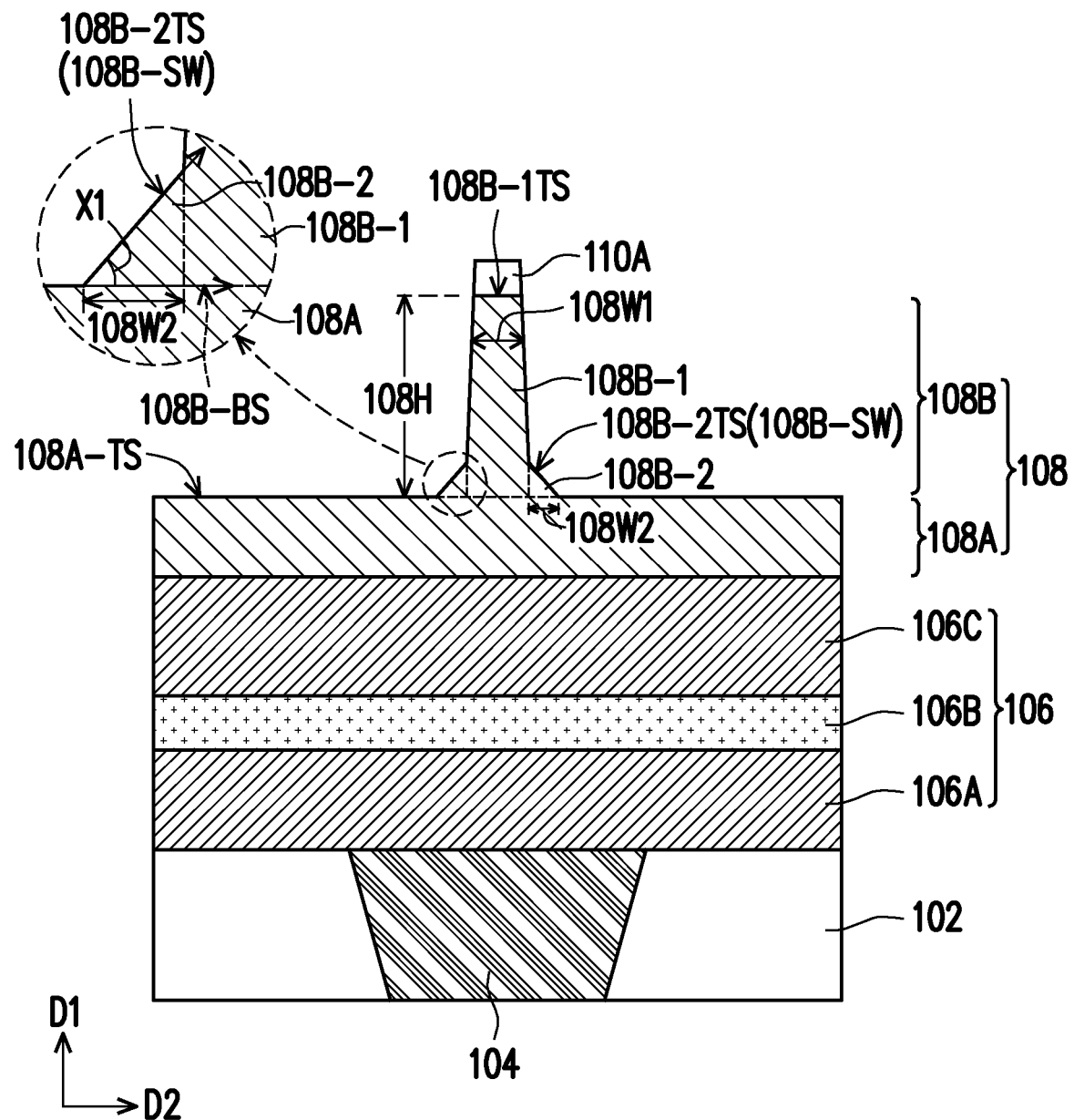

Referring to FIG. 3 to FIG. 6, various steps of performing a first patterning process to define a base portion 108A and a pillar portion 108B (as illustrated in FIG. 6) on the connecting material 108 is described.

Figure 3:
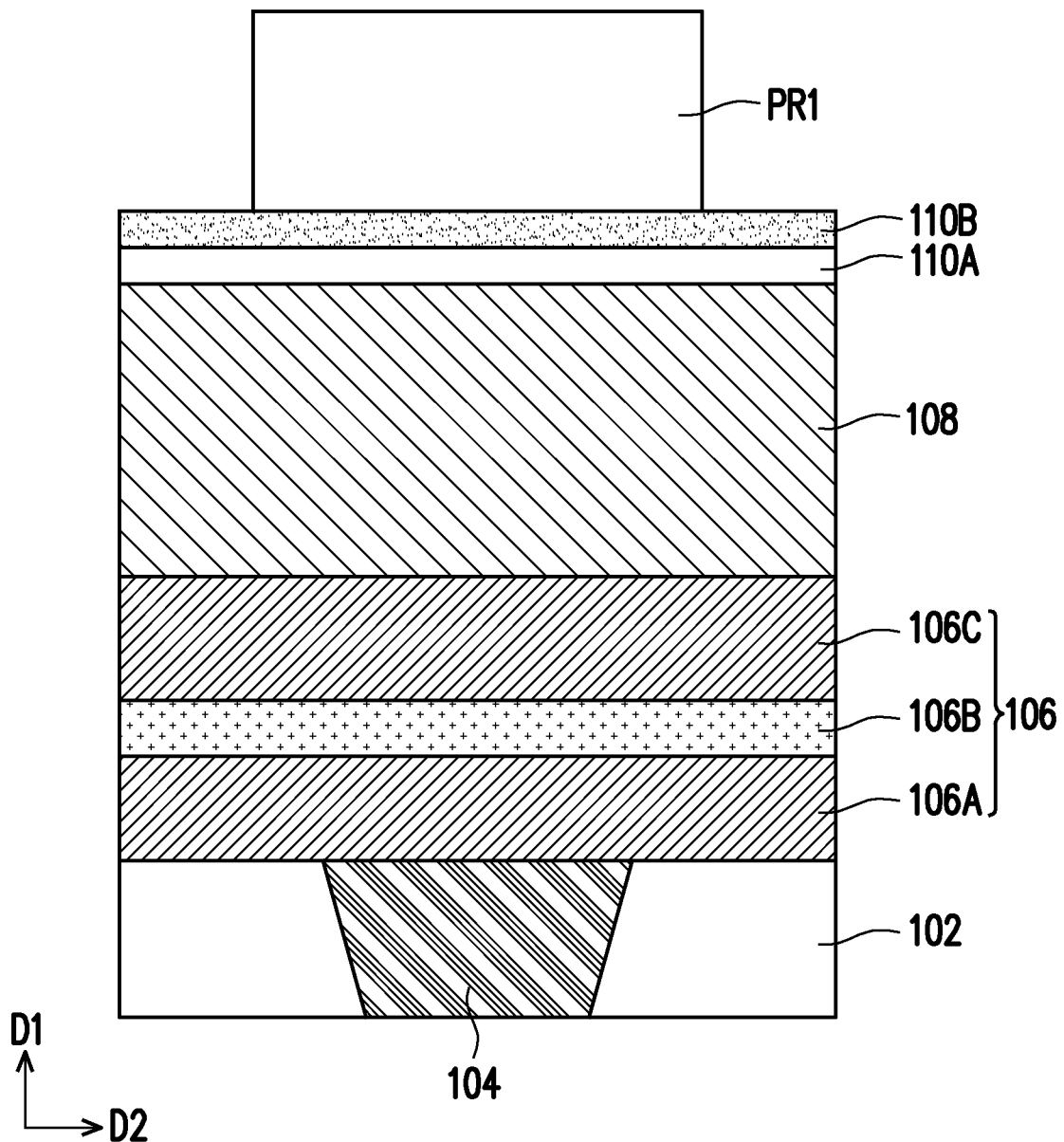

As illustrated in FIG. 3, in some embodiments, a photoresist pattern PR1 is formed on the second mask layer 110B. The photoresist pattern PR1 may be located in an area corresponding to a center position of the bottom electrode 104. In other words, the photoresist pattern PR1 is stacked up over the bottom electrode 104 in the first direction D1. The photoresist pattern PR1 may have a round, square, or rectangular profile in the top view, which may be adjusted based on design requirement.

In one embodiment, the photoresist pattern PR1 may be formed by coating (such as spin-coating) and photolithography processes or the like; however, the disclosure is not limited thereto. A material of the photoresist pattern PR1, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern PR1 is referred to as a photoresist layer or a resist layer. As shown in FIG. 3, for example, along the first direction D1 and the second direction D2, a size of the photoresist pattern PR1 is greater than a size of the bottom electrode 104.

Referring to FIG. 4, in some embodiments, a first etching process is performed to remove portions of the first mask layer 110A and portions of the second mask layer 110B. For example, in some embodiments, the first etching process includes a first step of etching the second mask layer 110B (e.g. the high-k material) using $Cl_2/BCl_3/O_2$ based plasma, and a second step of etching the first mask layer 110A (e.g. TiN) using $Cl_2/BCl_3$ based plasma. After the first etching process, sidewalls of the first mask layer 110A are aligned with sidewalls of the second mask layer 110B and sidewalls of the photoresist pattern PR1. Furthermore, a top surface of the connecting material 108 is partially revealed by the first mask layer 110A and the second mask layer 110B.

Referring to FIG. 5, in a subsequent step, a trimming process is performed to further reduce the lateral dimensions of the first mask layer 110A and the second mask layer 110B. For example, the trimming process is performed so as to optimize the dimensions of the first mask layer 110A and the second mask layer 110B so that the pillar portion 108B (as illustrated in FIG. 6) of the connecting material 108 formed in subsequent steps may have the desired width (minimal critical dimension). In some embodiments, the trimming process is performed using $Cl_2/HBr$ based plasma so as to reduce the lateral dimensions of the first mask layer 110A and the second mask layer 110B. In some embodiments, the photoresist pattern PR1 is removed after the trimming process by acceptable ashing process and/or photoresist stripping process. For example, in one embodiment, the photoresist pattern PR1 is removed using high pressure oxygen plasma, or the like. The disclosure is not limited thereto. After removing the photoresist pattern PR1, the trimmed first mask layer 110A and the second mask layer 110B are retained over the connecting material 108, and stacked up along the first direction D1.

Referring to FIG. 6, in some embodiments, a second etching process is performed to remove portions of the connecting material 108 to define a base portion 108A and a pillar portion 108B. For example, the second etching process is performed using $SF_6/O_2/Ar$ based plasma to completely remove the second mask layer 110B and portions of the connecting material 108. Up to here, the first patterning process is accomplished to define the base portion 108A and the pillar portion 108B on the connecting material 108.

As illustrated in FIG. 6, the first patterning process removes the second mask layer 110B, while a portion of the first mask layer 110A is retained. For example, the first mask layer 110A is retained on the pillar portion 108B of the connecting material 108. In some embodiments, the base portion 108A of the connecting material 108 is disposed on and in physical contact with the conductive material 106C of the memory material stack 106. The pillar portion 108B is disposed on the base portion 108A along the first direction D1 (the build-up direction), and an angle X1 of sidewalls 108B-SW of the pillar portion 108B relative to the base portion 108A is in a range of 30 degrees to 60 degrees. In certain embodiments, the pillar portion 108B is protruding out from the base portion 108A. Furthermore, a width of the pillar portion 108B decreases along the first direction D1 (the build-up direction). In certain embodiments, a width of the pillar portion 108B approximate to the base portion 108A is wider than tops of the pillar portion 108B away from the base portion 108A. For example, the pillar portion 108B has a first surface (bottom surface 108B-BS) and a second surface (top surface 108B-1TS) opposite to the first surface (bottom surface 108B-BS), the first surface (bottom surface 108B-BS) is joined with the base portion 108A, and a width of the first surface (bottom surface 108B-BS) is greater than a width of the second surface (top surface 108B-1TS).

As further illustrated in FIG. 6, the pillar portion 108B may include a pillar body 108B-1 and a pillar foot 108B-2 (e.g. tapered pillar foot). For example, the pillar body 108B-1 is disposed on the base portion 108A, whereas the pillar foot 108B-2 is extending out from the pillar body 108-1 and disposed on the base portion 108A. In some embodiments, the pillar foot 108B-2 surrounds a lower part of the pillar body 108B-1. In certain embodiments, the pillar body 108B-1 has a top surface 108B-1TS, the pillar foot 108B-2 has a beveled surface 108B-2TS (corresponding to sidewalls 108B-SW), and a step height difference exists in between the top surface 108B-1TS and the beveled surface 108B-2TS. In some embodiments, the beveled surface 108B-2TS is joined with a top surface 108A-TS of the base portion 108A. Furthermore, the pillar foot 108B-2 has the sidewalls 108B-SW with the angle X1 in a range of 30 degrees to 60 degrees. In some embodiments, the angle X1 is an included angle of the footing (e.g. pillar foot 108B-2) of the pillar portion 108B, which is measured from the bottom surface 108B-BS of the pillar portion 108B to the beveled surface 108B-2TS of the pillar foot 108B-2 (tapered pillar foot).

In the exemplary embodiment, by controlling the angle X1 of the pillar portion 108B (or the pillar foot 108B-2) in the range of 30 degrees to 60 degrees, the pillar portion 108B will have a higher structural integrity while avoiding line break. In comparison, if the angle X1 of the pillar portion 108B is outside of the range of 30 degrees to 60 degrees, then it is likely that the pillar portion 108B will have a poor profile for providing electrical interconnection, or an issue of line break/pillar collapse is likely to occur.

In various embodiments, a ratio of a width 108W1 (e.g. average width) of the pillar body 108B-1 to a width 108W2 (e.g. maximum width) of the pillar foot 108B-2 is in a range of 1:1 to 4:1. The ratio of the width 108W1 to the width 108W2 is kept in such a range to further improve the structural integrity of the pillar portion 108B. In some embodiments, the pillar portion has an aspect ratio (width 108W1 to height 108H) of 1:5 to 1:15. In one exemplary embodiment, the width 108W1 of the pillar body 108B-1 is in a range of 10 nm to 20 nm, and the width 108W2 is in a range of 5 nm to 10 nm. In certain embodiments, the height 108H of the pillar portion 108B is in a range of 100 nm to 150 nm. By controlling the dimensions of the pillar portion 108B in the above range, the structural integrity of the pillar portion 108B and the reliability of connection of the pillar portion 108B can be further improved.

Figure 7:
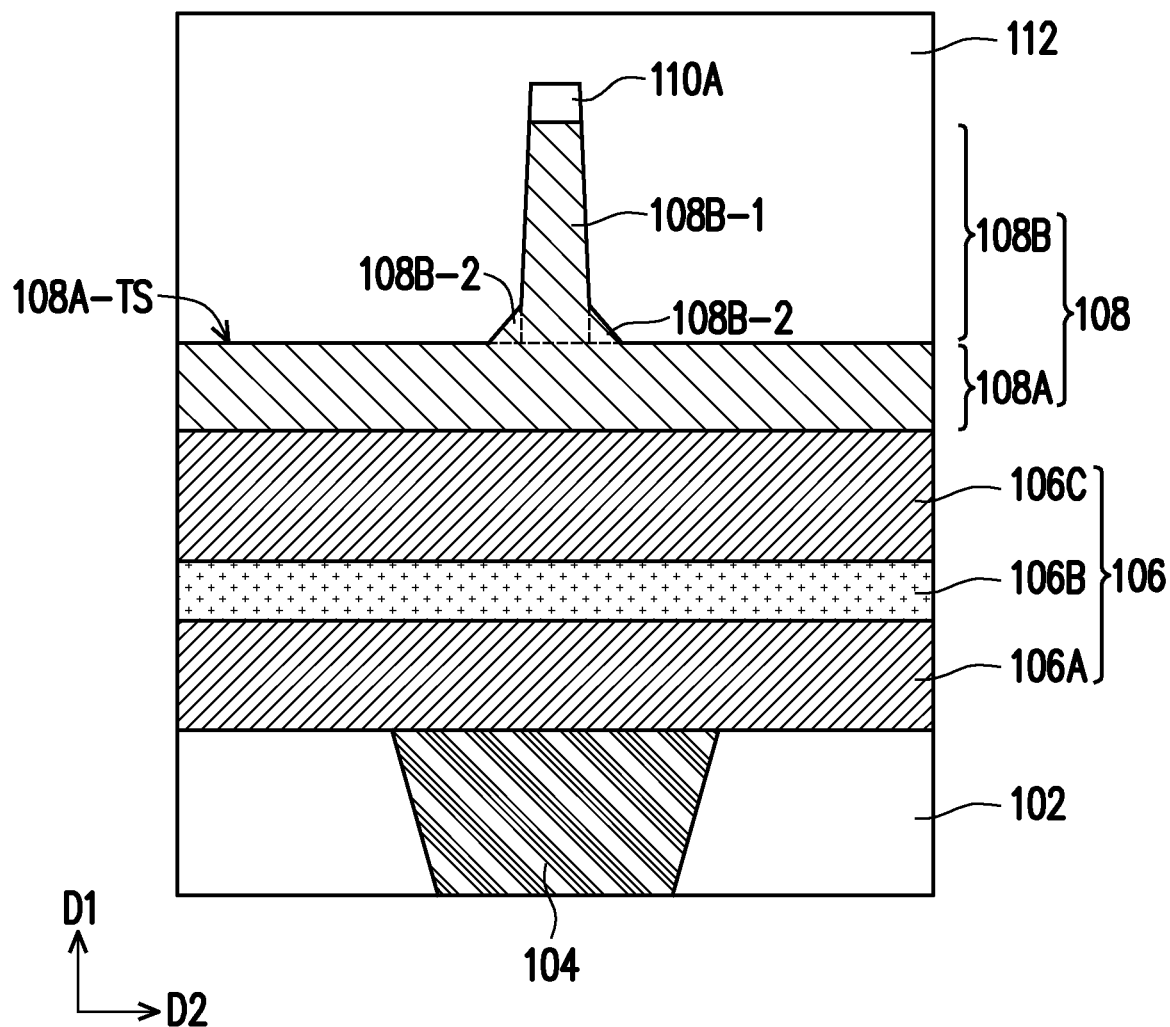

Referring to FIG. 7, in a subsequent step, a dielectric material 112 is formed on the base portion 108A and surrounding the pillar portion 108B of the connecting material 108 after the first patterning process. For example, the dielectric material 112 covers the top surface 108A-TS of the of the base portion 108A, wraps around the pillar portion 108B, and further cover the first mask layer 110A. In some embodiments, the dielectric material 112 includes a material, such as silicon oxide, silicon nitride, silicon oxynitride, silicon carbonitride, silicon carbide oxynitride, spin-on glass (SOG), phosphosilicate glass (PSG), borophosphosilicate glass (BPSG), fluorosilicate glass (FSG), carbon doped silicon oxide (e.g., SiCOH), polyimide, a spin-on dielectric material, a low-k dielectric material, and/or a combination thereof. It should be noted that the low-k dielectric materials are generally dielectric materials having a dielectric constant lower than 3.9. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. The dielectric material 112 may be formed by any suitable method, such as CVD (e.g., FCVD, PECVD, HDPCVD or SACVD), MLD, spin-on, sputtering, or other suitable methods. As shown in FIG. 7, at this stage, the pillar portion 108B of the connecting material 108 and the first mask layer 110A are embedded in the dielectric material 112. In other words, the pillar portion 108B and the first mask layer 110A are not revealed.

Figure 8:
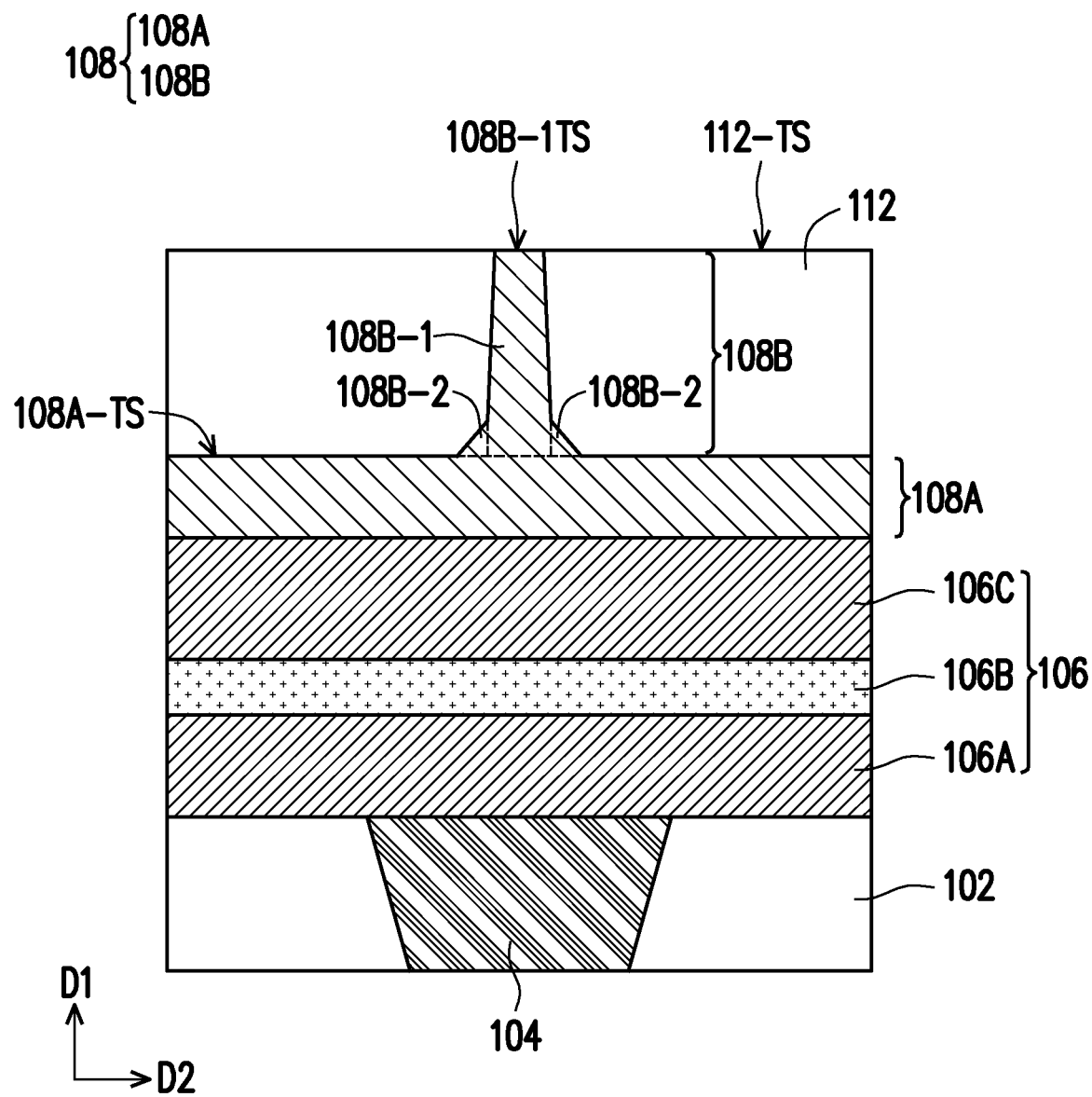

Referring to FIG. 8, after forming the dielectric material 112, a planarization process is performed through a mechanical grinding process and/or a chemical mechanical polishing (CMP) process to remove the first mask layer 110A and portions of the dielectric material 112. For example, as illustrated in FIG. 8, the planarization process is performed until the top surface 108B-1TS of the pillar portion 108B is revealed. In some embodiments, a top surface 112-TS of the dielectric material 112 is coplanar with the top surface 108B-1TS of the pillar portion 108B of the connecting material 108 after the planarization process. In some embodiments, after the mechanical grinding or chemical mechanical polishing (CMP) process, a cleaning step may be optionally performed. For example, the cleaning step is performed to clean and remove the residue generated from the planarization process. However, the disclosure is not limited thereto, and the planarization process may be performed through any other suitable methods.

Figure 9:
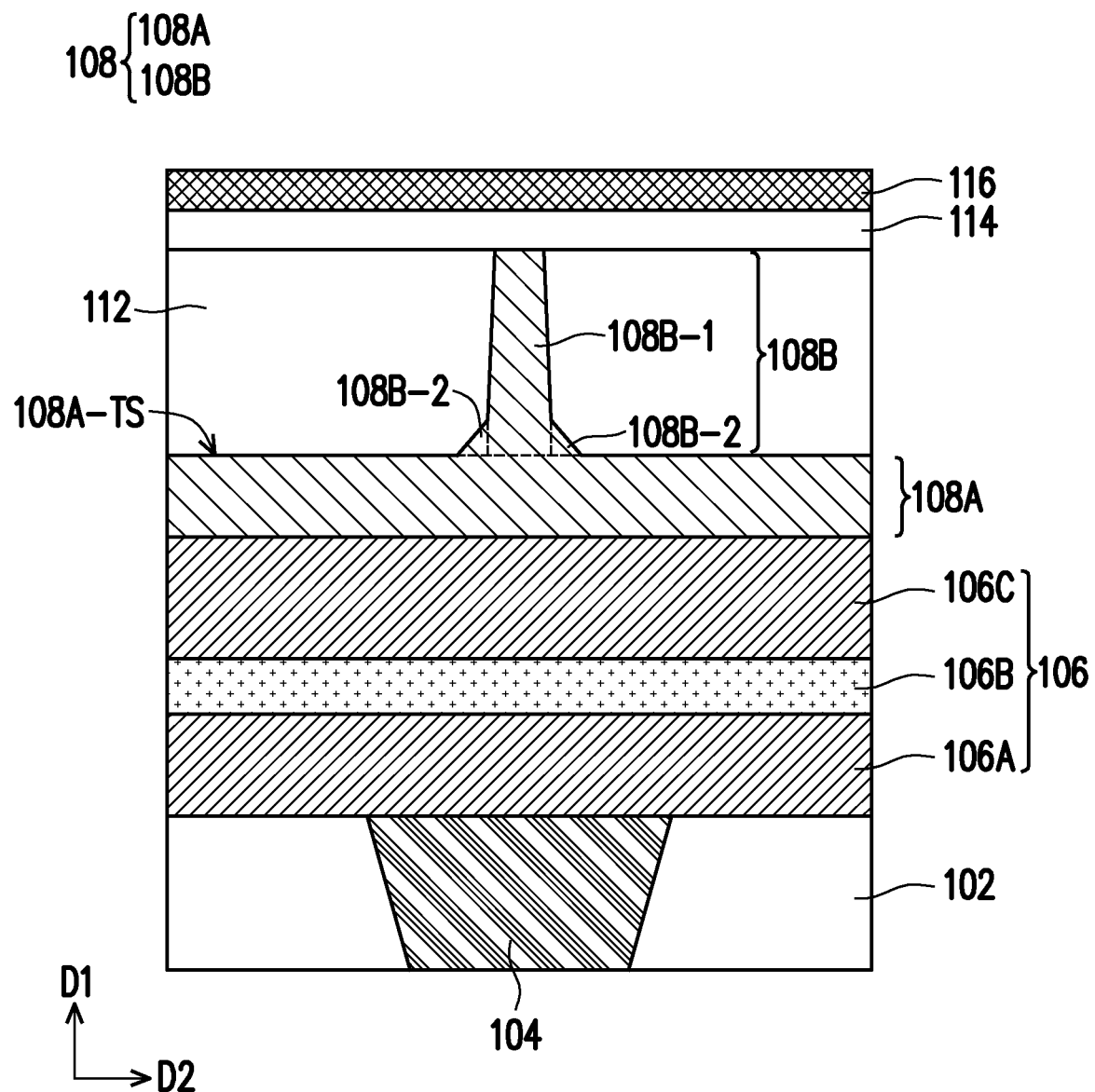

Referring to FIG. 9, in some embodiments, a selector material 114 and an electrode material 116 are sequentially formed on the dielectric material 112. For example, the selector material 114 is disposed between the dielectric material 112 and the electrode material 116, and further disposed between the pillar portion 108B of the connecting material 108 and the electrode material 116. In some embodiments, the selector material 114 is in physical contact with the pillar portion 108B of the connecting material 108, while the electrode material 116 is in physical contact with the selector material 114.

In some embodiments, a material of the selector material 114 includes an ovonic threshold switch (OTS) material. The OTS material is responsive to an applied voltage across the selector (114' illustrated in FIG. 11) formed in subsequent steps. For an applied voltage that is less than a threshold voltage, the selector (114' in FIG. 11) remains in an "off" state, e.g., an electrically nonconductive state. Alternatively, responsive to an applied voltage across the selector (114' in FIG. 11) that is greater than the threshold voltage, the selector (114' in FIG. 11) enters an "on" state, e.g., an electrically conductive state. That is, the selector (114' in FIG. 11) is referred to as a switch for determining to turn on or turn off the memory element (106' in FIG. 11).

In some embodiments, the OTS material of the selector material 114 is different from the transition metal oxide material of the storage element material 106B. The OTS material of the selector material 114 may include GeTe, AsGeSe, GeSbTe, GeSiAsTe, GeSe, GeSbSe, GeSiAsSe, GeS, GeSbS, GeSiAsS, or combinations thereof. Alternatively, the OTS material of the selector material 114 may include BTe, CTe, BCTe, CSiTe, BSiTe, BCSiTe, BTeN, CTeN, BCTeN, CSiTeN, BSiTeN, BCSiTeN, BTeO, CTeO, BCTeO, CSiTeO, BSiTeO, BCSiTeO, BTeON, CTeON, BCTeON, CSiTeON, BSiTeON, BCSiTeON, or combinations thereof. The selector material 114 may be formed by any suitable method, such as PVD, ALD, or the like. In some embodiments, the selector material 114 has a thickness of about 5 nm to about 20 nm. The material of the selector material 114 is different from the material of the storage element material 106B, for example.

In some embodiments, the electrode material 116 is conformally formed on and in physical contact with the selector material 114. The electrode material 116, for example, includes a conductive material, such as Ti, Co, Cu, AlCu, W, TiN, TiW, TiAl, TiAlN, TaN, Pt, or a combination thereof. The electrode material 116 may be formed by any suitable method, such as CVD, PVD, or the like. In some embodiments, the electrode material 116 has a thickness of about 20 nm to about 50 nm. In one embodiment, the material of the electrode material 116 is the same as the material of the connecting material 108. For example, the electrode material 116 includes W. Alternatively, the material of the electrode material 116 may be the same as or different from the materials of the conductive material 106A and the conductive material 106C.

Figure 10:
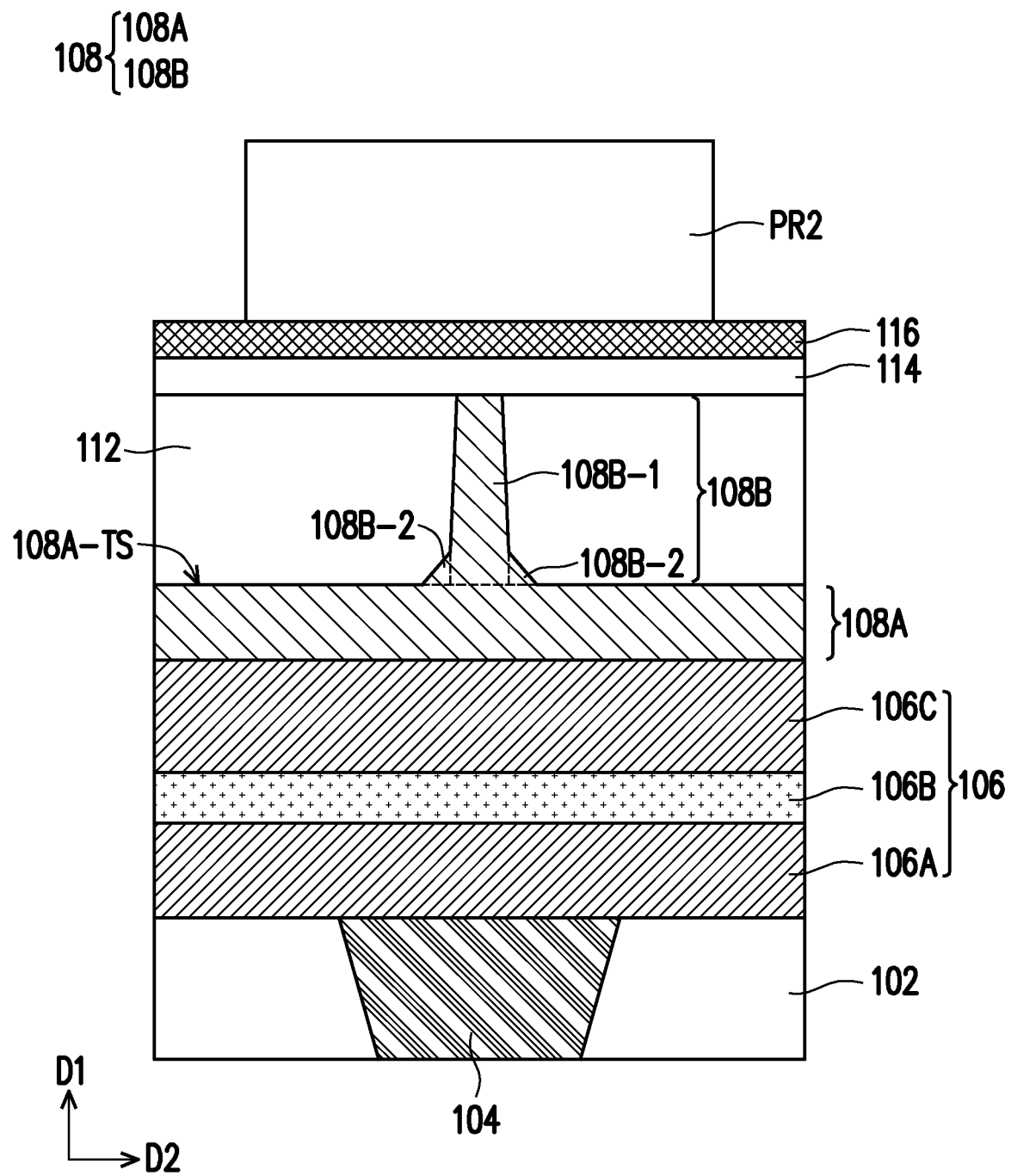

Referring to FIG. 10, in some embodiments, after the formations of the selector material 114 and the electrode material 116, a photoresist pattern PR2 is formed on the electrode material 116 along the first direction D1. The photoresist pattern PR2 may be formed by coating (such as spin-coating) and photolithography processes or the like; however, the disclosure is not limited thereto. A material of the photoresist pattern PR2, for example, includes a positive resist material or a negative resist material, that is suitable for a patterning process such as a photolithography process with a mask or a mask-less photolithography process (for instance, an electron-beam (e-beam) writing or an ion-beam writing). In the disclosure, the photoresist pattern PR2 is referred to as a photoresist layer or a resist layer.

Referring to FIG. 11, a second patterning process is performed to pattern the memory material stack 106, the connecting material 108, the selector material 114 and the electrode material 114 to respectively form a memory element 106', a connecting structure 108' having the base portion 108A and the pillar portion 108B, a selector 114' and a top electrode 116'. For example, the second patterning process is performed by using the photoresist pattern PR2 as a mask, and independently include an etching step, such as a dry etching, a wet etching or a combination thereof. In some embodiments, the conductive material 106A, storage element material 106B and conductive material 106C of the memory material stack 106 are patterned to form a first conductive layer 106A', a storage layer 106B' and a second conductive layer 106C' of the memory element 106'. For example, the first conductive layer 106A' is disposed on and physically connected to the bottom electrode 104. The storage layer 106B' is located in between the first conductive layer 106A' and the second conductive layer 106C'. The second conductive layer 106C' is disposed on the storage layer 106B' and physically connected to the base portion 108A of the connecting structure 108'.

In some embodiments, the memory element 106' is a metal-insulator-metal (MIM) structure and is referred to as an RRAM (resistive random access memory) device. In some embodiments, the first conductive layer 106A' is referred to as a bottom electrode of the RRAM and the second conductive layer 106C' is referred to as a top electrode of the RRAM.

Generally, a RRAM device or element (e.g., the memory element 106') operates under the principle that a dielectric material/layer, which is normally insulating, can be made to conduct through a filament or conduction path formed after the application of a sufficiently high voltage. The conduction path formation can arise from different mechanisms, including but not limited to defect, metal migration, oxygen vacancy, etc. As described above, during a write operation to the memory element 106', a 'set' voltage is applied across the top and bottom electrodes to change the variable resistance dielectric material from a first resistivity (e.g., a high resistance state (HRS), where a filament or conduction path between the top and bottom electrodes are broken) to a second resistivity (e.g., a low resistance state (LRS), where the filament or conduction path between the top and bottom electrodes are established).

Similarly, a 'reset' voltage is applied across the top and bottom electrodes to change the variable resistance dielectric material from the second resistivity back to the first resistivity, for example, from LRS to HRS. Therefore, in instances where the LRS and HRS correspond to logic "1" and logic "0" states (or vice versa), respectively; the 'set' and 'reset' voltages can be used to store digital information bits in the RRAM cell (e.g. memory cell MC1 in FIG. 12) through the memory element 106' to provide relevant memory functions.

As further illustrated in FIG. 11, the connecting structure 108' is formed over the memory element 106', and includes the base portion 108A and the pillar portion 108B. The details of the base portion 108A and the pillar portion 108B is the same as that described for the connecting material 108 in FIG. 6, thus will be omitted herein. In some embodiments, the dielectric material 112 is patterned to form a dielectric layer 112' during the second patterning process. For example, the dielectric layer 112' is disposed on the base portion 108A and surrounding the pillar portion 108B of the connecting structure 108'. Furthermore, a top surface 112-TS of the dielectric layer 112' is coplanar with the top surface 108B-1TS of the pillar portion 108B of the connecting structure 108'. In some embodiments, the connecting structure 108' is disposed on the memory element 106', and electrically connecting the memory element 106' to the selector 114'. The selector 114' is disposed on the dielectric layer 112' and is in physical contact with the pillar portion 108B of the connecting structure 108', while the top electrode 116' is disposed on and in physical contact with the selector 114'.

In some embodiments, after the second patterning process, the photoresist pattern PR2 is removed by acceptable ashing process and/or photoresist stripping process, such as using an oxygen plasma or the like; however, the disclosure is not limited thereto. After the second patterning process, sidewalls 106A-SW of the first conductive layer 106A', sidewalls 106B-SW of the storage layer 106B', sidewalls 106C-SW of the second conductive layer 106C', sidewalls 108A-SW of the base portion 108A, sidewalls 112SW of the dielectric layer 112', sidewalls 114SW of the selector 114' and sidewalls 116SW of the top electrode 116' are substantially coplanar and aligned with one another.

Figure 12:
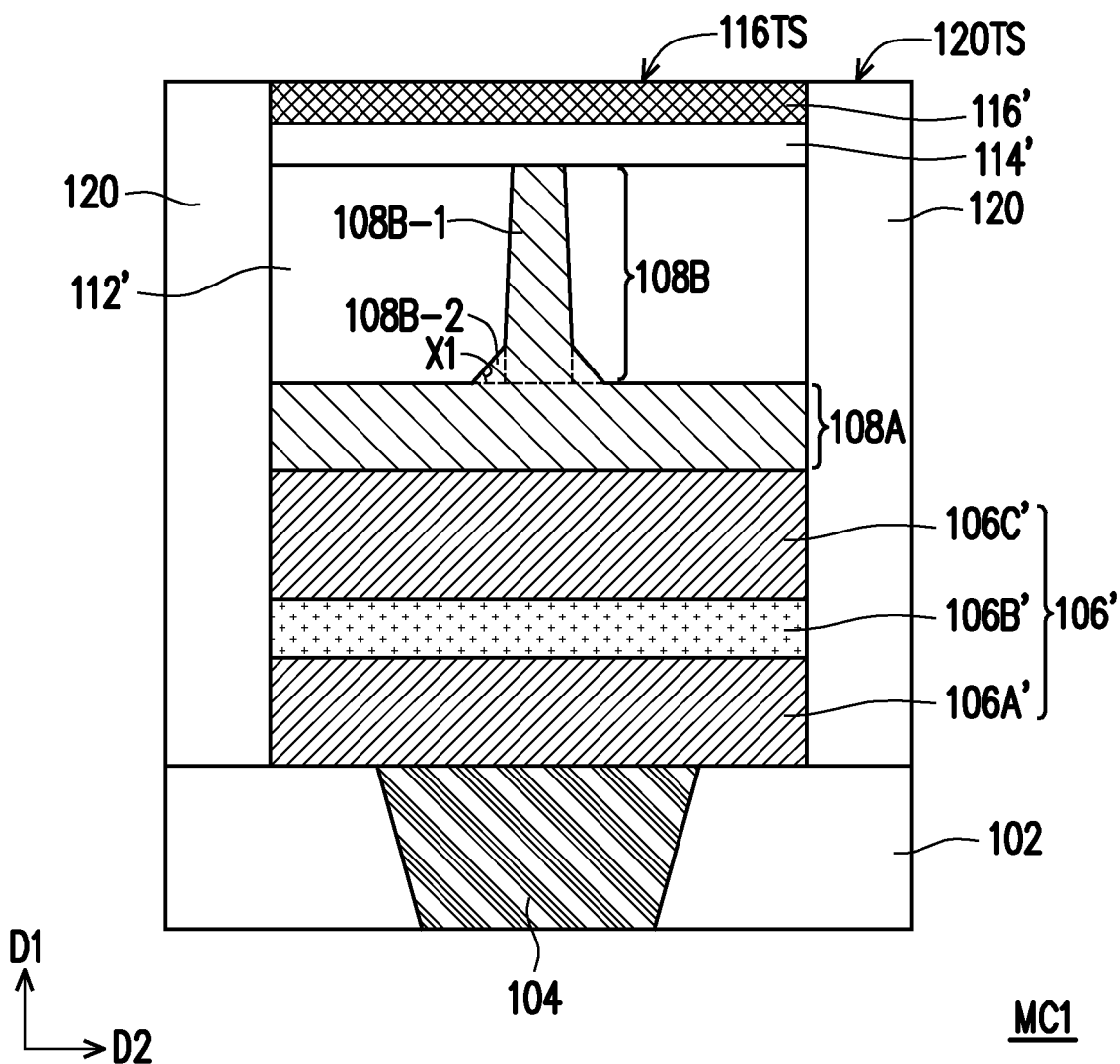

Referring to FIG. 12, in a subsequent step, a dielectric layer 120 is formed on the dielectric layer 102 to cover and surround the memory element 106', the connecting structure 108', the selector 114' and the top electrode 116'. For example, the dielectric layer 120 covers the sidewalls 106A-SW of the first conductive layer 106A', covers the sidewalls 106B-SW of the storage layer 106B', covers the sidewalls 106C-SW of the second conductive layer 106C', covers the sidewalls 108A-SW of the base portion 108A, covers the sidewalls 112SW of the dielectric layer 112', covers the sidewalls 114SW of the selector 114' and covers the sidewalls 116SW of the top electrode 116'. In some embodiments, a planarization process (e.g., a chemical-mechanical planarization (CMP) process) is performed to remove excessive dielectric materials of the dielectric layer 120, so that a top surface 120TS of the dielectric layer 120 is substantially coplanar with a top surface 116TS of the top electrode 116'. Up to here, a memory cell MC1 according to some embodiments of the present disclosure is accomplished. In some embodiments, the dielectric layer 112' and the dielectric layer 120 are collectively referred as an interlayer dielectric (ILD) of the memory cell MC1.

As illustrated in FIG. 12, the selector 114' is electrically coupled to the memory element 106' in the memory cell MC1. For example, the second conductive layer 106C' of the memory element 106' is electrically connected to the selector 114' through the connecting structure 108'. That is, the memory element 106' is electrically coupled to the selector 114' in series. With such configuration, the voltage may be applied to the selector 114' for controlling the status (e.g. "on" or "off") of the memory element 106'. While the memory element 106' is turned on, the voltages are further applied to the first conductive layer 106A' and the second conductive layer 106C' of the memory element 106' for operating the memory functions thereof (via HRS and LRS). As illustrated in FIG. 12, the memory cell MC1 has one selector 114' and one memory element 106' electrically connected to each other and located between the overlying interconnection structures and underlying interconnection structures (not shown). In other words, the memory cell MC1 is implemented as a 1-selector-1-resistor (1S1R) configuration. However, the disclosure is not limited thereto, and in other embodiments, the memory cell may include one selector 114' and a plurality of memory elements electrically connected to the selector 114'. In some other embodiments, the memory cell MC1 is implemented as a 1-selector-1-transitor-1-resistor (1S1T1R) configuration.

In the exemplary embodiment, for the memory cell MC1, the pillar portion 108B of the connecting structure 108' is designed to have sidewalls 108B-SW having the angle X1 in a range of 30 degrees to 60 degrees, and is formed by patterning processes using a dual hard mask approach. As such, the critical dimensions of the pillar portion 108B of the connecting structure 108 may be appropriately controlled. Furthermore, the connecting structure 108' will have higher structural integrity and improved profile, and the connection between the selector 114' and the memory element 106' is ensured. Overall, a line break issue at memory cell boundaries, peeling or contact failure of the connecting structure 108' may be avoided.

Figure 13:
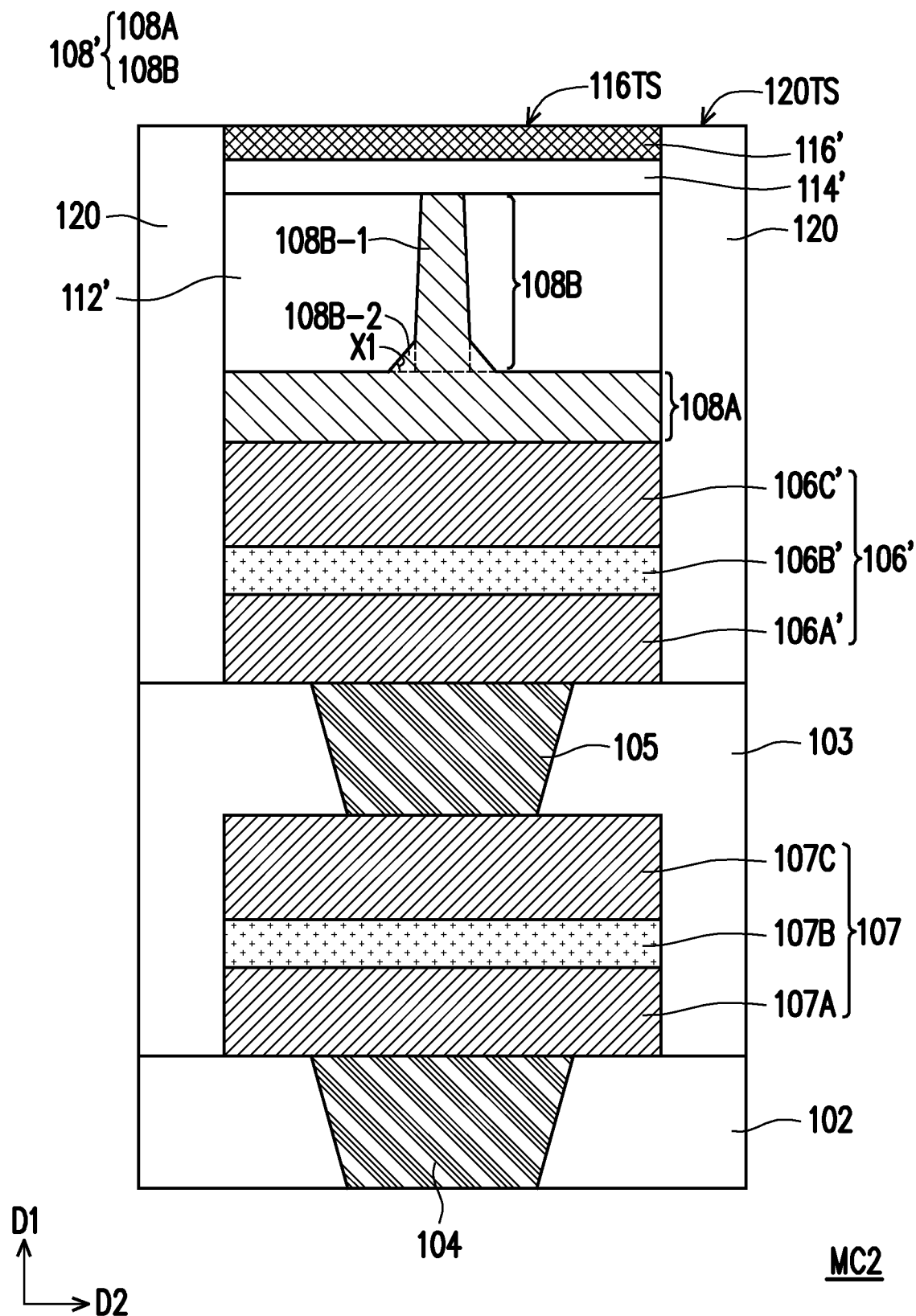
FIG. 13 is a schematic sectional view of a memory cell in accordance with some other embodiments of the present disclosure.

FIG. 13 is a schematic sectional view of a memory cell in accordance with some other embodiments of the present disclosure. The memory cell MC2 illustrated in FIG. 13 is similar to the memory cell MC1 illustrated in FIG. 12. Therefore, the same reference numerals are used to refer to the same or liked parts, and its detailed description will be omitted herein. The difference between the embodiments is that a second memory element 107 is further included in the memory cell MC2. In the previous embodiment, a 1-selector-1-resistor (1S1R) configuration is implemented in the memory cell MC1. However, the disclosure is not limited thereto. For example, referring to FIG. 13 a 1-selector-2-resistor (1S2R) configuration is implemented in the memory cell MC2. In other words, it is appreciated that the memory cell of the disclosure may be implemented with any one of a 1S1R configuration, a 1S2R configuration, a 1S3R configuration, a 1S4R configuration . . . , a 1SxR configuration, etc. It is noted that x is a positive integer.

In some embodiments, in the memory cell MC2 which has the 1S2R configuration, the memory cell MC2 includes one selector 114' and two memory elements 106' and 107. The selector 114' and the memory element 106' is similar to that described in FIG. 12, hence its detailed description will not be repeated herein. As illustrated in FIG. 13, the memory cell MC2 further includes a second memory element 107 disposed in between the memory element 106' and the bottom electrode 104. In other words, the memory element 106' is electrically connected to the bottom electrode 104 through the second memory element 107.

The second memory element 107 may include a first conductive layer 107A, a storage layer 107B and a second conductive layer 107C. The first conductive layer 107A is electrically and physically connected to the bottom electrode 104. The storage layer 107B is disposed on the first conductive layer 107A, and located in between the first conductive layer 107A and the second conductive layer 107C. The second conductive layer 107C is disposed on and in physical contact with the storage layer 107B. The formation methods and materials of the memory element 107 are the same as or similar to the formation methods and materials of the memory element 106' described previously, and thus are not repeated herein.

In some embodiments, the memory cell MC2 further includes an electrode layer 105 disposed on and in physical contact with the second conductive layer 107C. Furthermore, a dielectric layer 103 is formed to surround the memory element 107 and the electrode layer 105. The formation and material of the electrode layer 105 may be similar to the formation and material of the bottom electrode 104, and thus are not repeated herein. Similarly, the formation and material of the dielectric layer 103 may be similar to the formation and material of the dielectric layer 102, and thus are not repeated herein. Furthermore, the selector 114', the memory element 106' and the memory element 107 are electrically coupled to each other in series.

In the exemplary embodiment, for the memory cell MC2, the pillar portion 108B of the connecting structure 108' is designed to have sidewalls 108B-SW having the angle X1 in a range of 30 degrees to 60 degrees, and is formed by patterning processes using a dual hard mask approach. As such, the critical dimensions of the pillar portion 108B of the connecting structure 108 may be appropriately controlled. Furthermore, the connecting structure 108' will have higher structural integrity and improved profile, and the connection between the selector 114' and the memory element 106' is ensured. Overall, a line break issue at memory cell boundaries, peeling or contact failure of the connecting structure 108' may be avoided.

Figure 14:
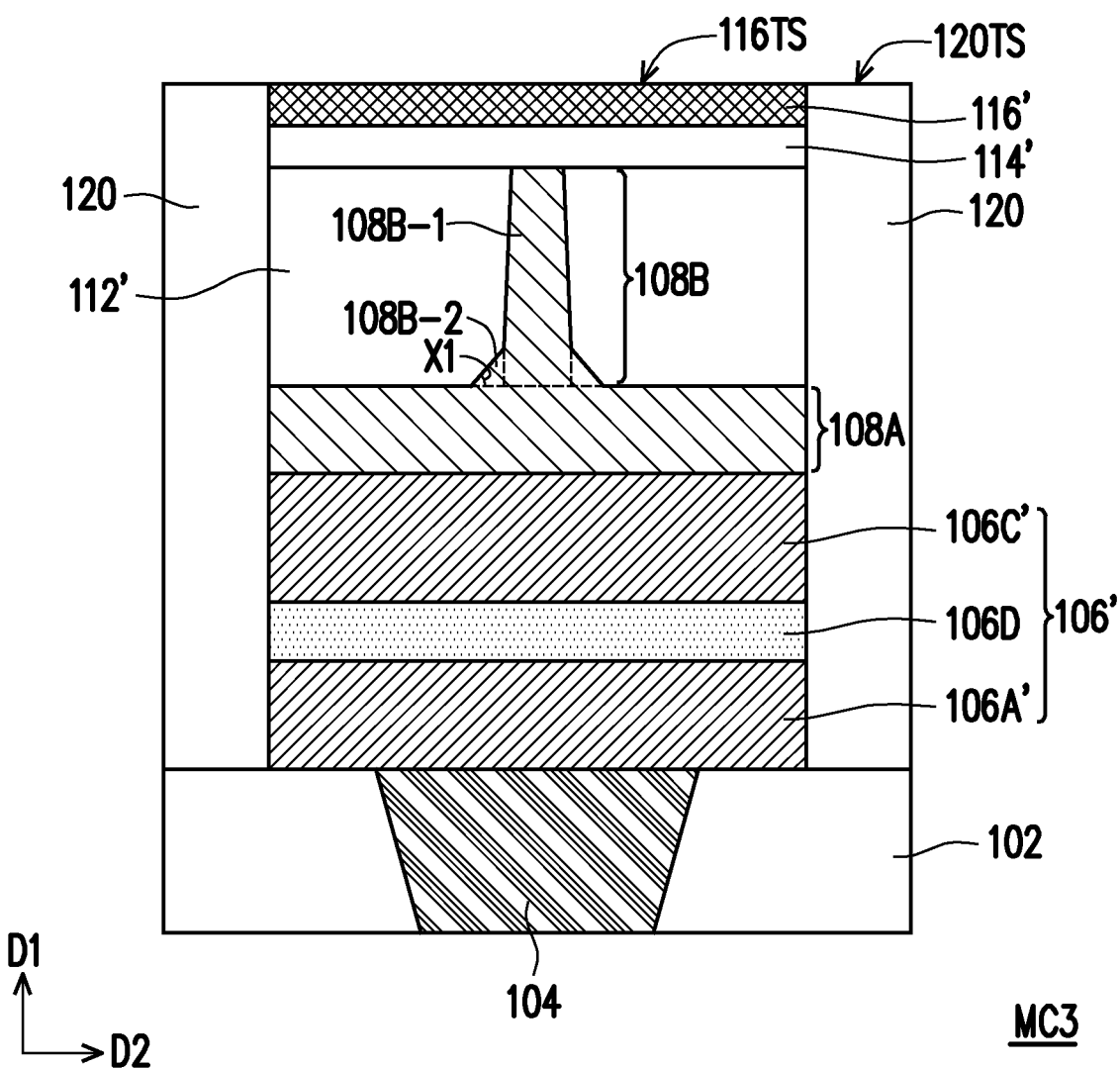
FIG. 14 is a schematic sectional view of a memory cell in accordance with some other embodiments of the present disclosure.

FIG. 14 is a schematic sectional view of a memory cell in accordance with some other embodiments of the present disclosure. The memory cell MC3 illustrated in FIG. 14 is similar to the memory cell MC1 illustrated in FIG. 12. Therefore, the same reference numerals are used to refer to the same or liked parts, and its detailed description will be omitted herein. In the previous embodiments, the memory element 106' is directed to RRAM devices. However, the disclosure is not limited thereto, and the memory element may be applied to a phase change random access memory (PCRAM) device. For example, referring to FIG. 14, the memory cell MC3 includes a storage layer 106D located in between the first conductive layer 106A' and the second conductive layer 106C', whereby the storage layer 106D include a phase change material.

In some embodiments, the phase change material of the storage layer 106D includes a chalcogenide material, such as an indium (In)-antimony (Sb)-tellurium (Te) (IST) material or a germanium (Ge)-antimony (Sb)-tellurium (Te) (GST) material. The ISG material may include $In_2Sb_2Te_5$, $In_1Sb_2Te_4$, $In_1Sb_4Te_7$, or the like. The GST material may include $Ge_8Sb_8Te_8$, $Ge_2Sb_2Te_5$, $Ge_1Sb_2Te_4$, $Ge_1Sb_4Te_7$, $Ge_4Sb_4Te_7$, $Ge_4SbTe_2$, $Ge_6SbTe_2$, or the like. The hyphenated chemical composition notation, as used herein, indicates the elements included in a particular mixture or compound, and is intended to represent all stoichiometries involving the indicated elements. Other phase change materials may include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. The formation of the storage layer 106D may be similar to that of the storage layer 106B' illustrated in FIG. 12, and may have substantially the same thickness.

Due to the storage layer 106D being inclusive of the phase change material, the storage layer 106D has a variable phase representing a data bit. For example, the storage layer 106D has a crystalline phase and an amorphous phase which are interchangeable. The crystalline phase and the amorphous phase may respectively represent a binary "1" and a binary "0", or vice versa. Accordingly, the storage layer 106D has a variable resistance that changes with the variable phase of the storage layer 106D. For example, the storage layer 106D has a high resistance in the amorphous phase and a low resistance in the crystalline phase.

In the operation of the memory cell MC3, the data state of the memory cell MC3 is read by measuring the resistance of the memory cell MC3 (i.e., the resistance from the first conductive layer 106A' (e.g. serving as the bottom electrode) to the second conductive layer 106C' (e.g. serving as the top electrode)). The phase of the storage layer 106D represents the data state of the memory cell MC3, the resistance of the storage layer 106D, or the resistance of the memory cell MC3. Furthermore, the data state of the memory cell MC3 may be set and reset by changing the phase of the storage layer 106D.

In some embodiments, the phase of the storage layer 106D is changed by heating. For example, the first conductive layer 106A' (or second conductive layer 106C') heats the storage layer 106D to a first temperature that induces crystallization of the storage layer 106D, so as to change the storage layer 106D to the crystalline phase (e.g., to set the memory cell MC3). Similarly, the first conductive layer 106A' (or second conductive layer 106C') heats the storage layer 106D to a second temperature that melts the storage layer 106D, so as to change the storage layer 106D to the amorphous phase (e.g., to reset the memory cell MC3). The first temperature is lower than the second temperature. In some embodiments, the first temperature is 100° C. to 200° C. and the second temperature is 500° C. to 800° C. In the disclosure, for the memory cell MC3, the first conductive layer 106A' may be referred to as a heater, or the first conductive layer 106A' and the second conductive layer 106C' may be together referred to as the heater.

The amount of heat generated by the first conductive layer 106A' (or second conductive layer 106C') varies in proportion to the current applied to the first conductive layer 106A' (or second conductive layer 106C'). That is, the storage layer 106D is heated up to a temperature (i.e., the second temperature) higher than the melting temperature when a current passes through it. The temperature is then quickly dropped below the crystallization temperature. In the case, a portion of the storage layer 106D is changed to the amorphous state with high resistivity, and thus the state of the memory cell MC3 is changed to a high resistance state. Then, the portion of the storage layer 106D may be reset back to the crystalline state by heating up the storage layer 106D to a temperature (i.e., the first temperature) higher than the crystallization temperature and lower than the melting temperature, for a certain period.

In the exemplary embodiment, for the memory cell MC3, the pillar portion 108B of the connecting structure 108' is designed to have sidewalls 108B-SW having the angle X1 in a range of 30 degrees to 60 degrees, and is formed by patterning processes using a dual hard mask approach. As such, the critical dimensions of the pillar portion 108B of the connecting structure 108 may be appropriately controlled. Furthermore, the connecting structure 108' will have higher structural integrity and improved profile, and the connection between the selector 114' and the memory element 106' is ensured. Overall, a line break issue at memory cell boundaries, peeling or contact failure of the connecting structure 108' may be avoided.

Figure 15:
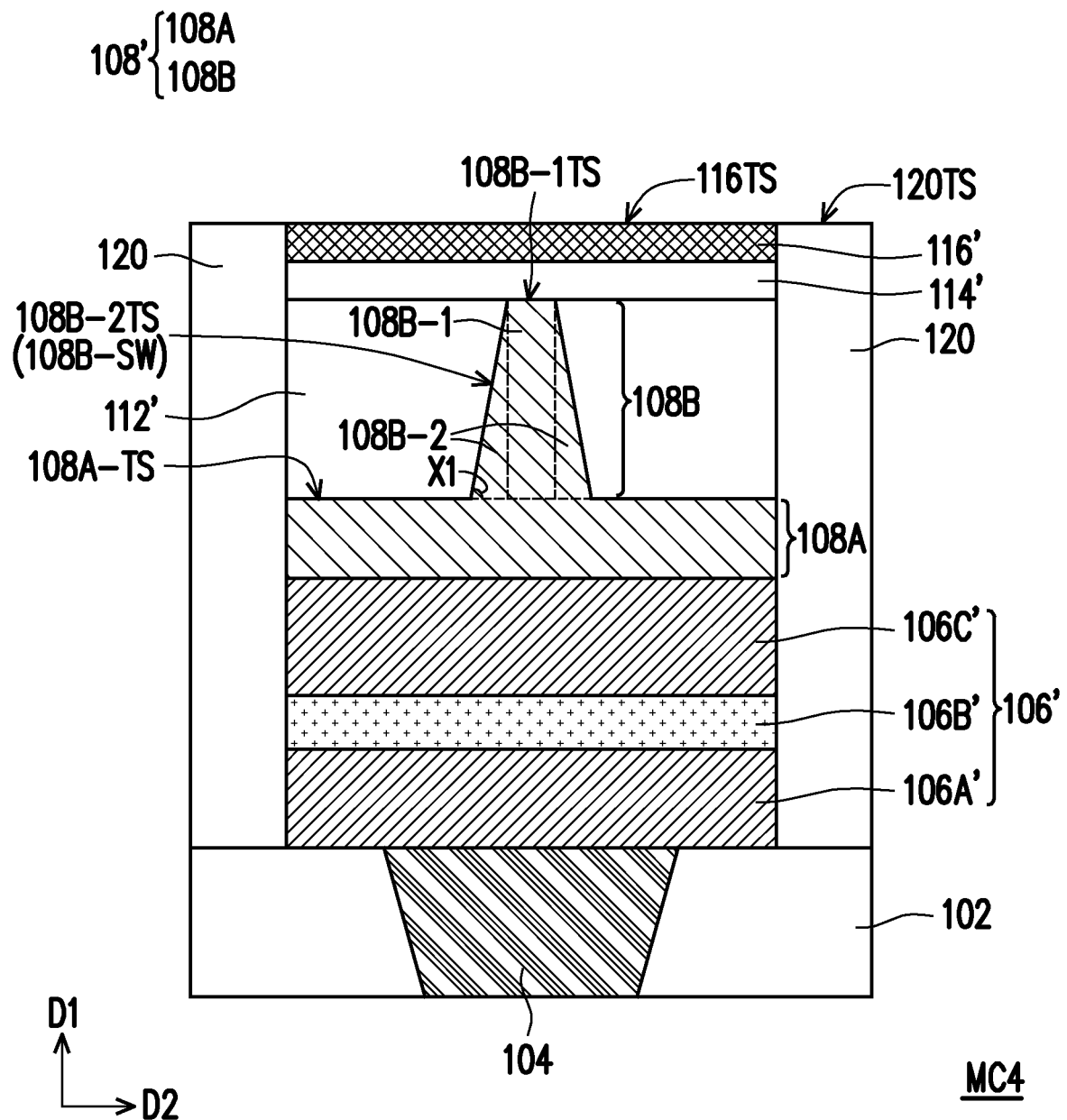
FIG. 15 is a schematic sectional view of a memory cell in accordance with some other embodiments of the present disclosure.

FIG. 15 is a schematic sectional view of a memory cell in accordance with some other embodiments of the present disclosure. The memory cell MC4 illustrated in FIG. 15 is similar to the memory cell MC1 illustrated in FIG. 12. Therefore, the same reference numerals are used to refer to the same or liked parts, and its detailed description will be omitted herein. The difference between the embodiments is in the design of the pillar portion 108B of the connecting structure 108'.

As illustrated in FIG. 15, the connecting structure 108' includes a body portion 108A disposed on the memory element 106', and a pillar portion 108B disposed on the body portion 108A. In some embodiments, the pillar portion 108B includes a pillar body 108B-1 and a pillar foot 108B-2 (or tapered pillar foot). For example, the pillar body 108B-1 is disposed on the base portion 108A, whereas the pillar foot 108B-2 is extending out from the pillar body 108-1 and disposed on the base portion 108A. In some embodiments, the pillar foot 108B-2 completely surrounds the pillar body 108B-1. In certain embodiments, the pillar body 108B-1 has a top surface 108B-1TS, the pillar foot 108B-2 has a beveled surface 108B-2TS (corresponding to sidewalls 108B-SW), wherein the top surface 108B-1TS is joined with the beveled surface 108B-2TS. Furthermore, the beveled surface 108B-2TS is joined with a top surface 108A-TS of the base portion 108A. In addition, the pillar foot 108B-2 has the sidewalls 108B-SW with the angle X1 in a range of 30 degrees to 60 degrees.

In the exemplary embodiment, for the memory cell MC4, the pillar portion 108B of the connecting structure 108' is designed to have sidewalls 108B-SW having the angle X1 in a range of 30 degrees to 60 degrees, and is formed by patterning processes using a dual hard mask approach. As such, the critical dimensions of the pillar portion 108B of the connecting structure 108 may be appropriately controlled. Furthermore, the connecting structure 108' will have higher structural integrity and improved profile, and the connection between the selector 114' and the memory element 106' is ensured. Overall, a line break issue at memory cell boundaries, peeling or contact failure of the connecting structure 108' may be avoided.

Figure 16:
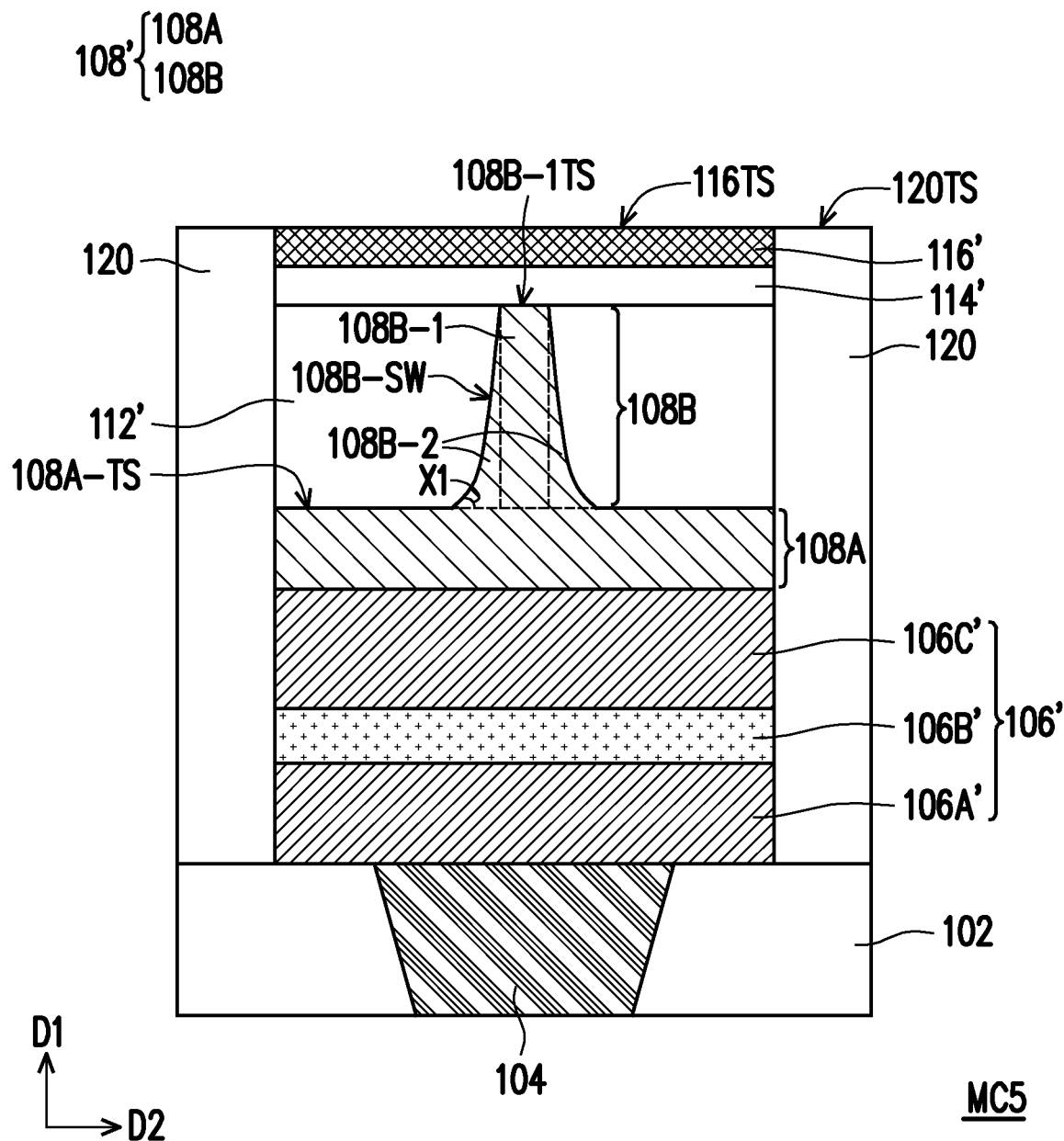
FIG. 16 is a schematic sectional view of a memory cell in accordance with some other embodiments of the present disclosure.

FIG. 16 is a schematic sectional view of a memory cell in accordance with some other embodiments of the present disclosure. The memory cell MC5 illustrated in FIG. 16 is similar to the memory cell MC1 illustrated in FIG. 12. Therefore, the same reference numerals are used to refer to the same or liked parts, and its detailed description will be omitted herein. The difference between the embodiments is in the design of the pillar portion 108B of the connecting structure 108'.

In the previous embodiments, the pillar foot 108B-2 of the pillar portion 108B is shown to have a beveled surface 108B-2TS. However, the disclosure is not limited thereto. As illustrated in FIG. 16, in some embodiments, the pillar portion 108B includes a pillar body 108B-1 and a pillar foot 108B-2 (e.g. tapered pillar foot), and sidewalls 108B-SW of the pillar portion 108B are curved sidewalls. Furthermore, it is the pillar foot 108B-2 of the pillar portion 108B that include the curved sidewalls. In some embodiments, the curved sidewalls (sidewalls 108B-SW) extends from the top surface 108B-1TS of the pillar body 108B-1 towards a top surface 108A-TS of the base portion 108A.

In the exemplary embodiment, for the memory cell MC5, the pillar portion 108B of the connecting structure 108' is designed to have sidewalls 108B-SW (curved sidewalls) having the angle X1 in a range of approximately 30 degrees to 60 degrees, and is formed by patterning processes using a dual hard mask approach. As such, the critical dimensions of the pillar portion 108B of the connecting structure 108 may be appropriately controlled. Furthermore, the connecting structure 108' will have higher structural integrity and improved profile, and the connection between the selector 114' and the memory element 106' is ensured. Overall, a line break issue at memory cell boundaries, peeling or contact failure of the connecting structure 108' may be avoided.

Figure 17:
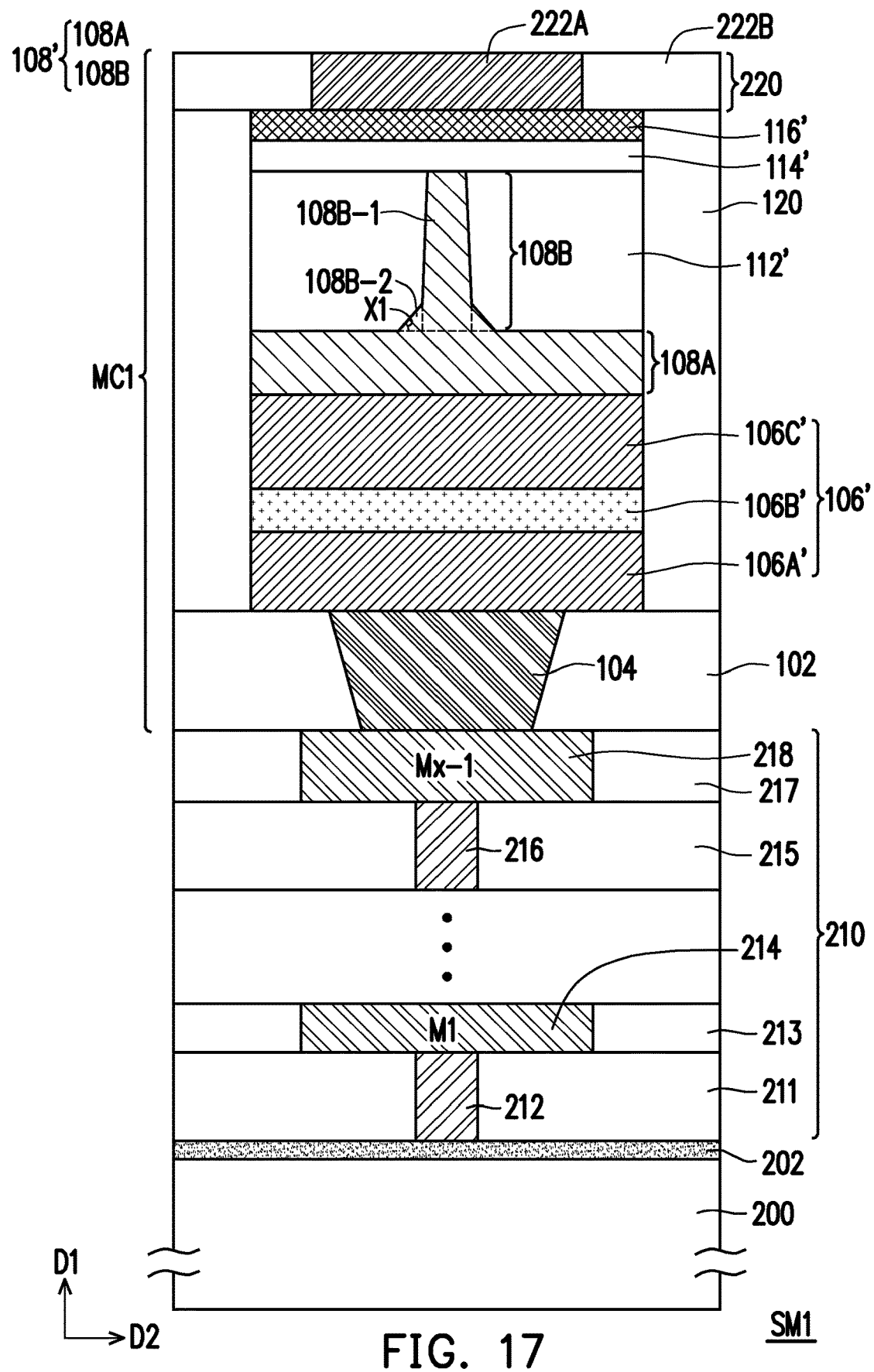
FIG. 17 is a schematic sectional view of a semiconductor device in accordance with some embodiments of the present disclosure.

FIG. 17 is a schematic sectional view of a semiconductor device in accordance with some embodiments of the present disclosure. The memory cell MC1 illustrated in the following embodiments is applied to, but not limited thereto, a RRAM cell. The structures, materials, and processes may be similar to what are shown in, and discussed referring to, FIG. 1 through FIG. 12. The details are thus no repeated herein. It is noted that other memory cells MC2, MC3, MC4 and MC5 may individually substitute the memory cell MC1 to form the semiconductor device of the example.

Referring to FIG. 17, a semiconductor device SM1 includes a substrate 200, a device region 202, a first interconnect structure 210, the memory cell MC1 and the second interconnect structure 220. In some embodiments, the substrate 200 is a semiconductor substrate, such as a bulk semiconductor, a semiconductor-on-insulator (SOI) substrate, or the like. The substrate 200 may be doped (e.g., with a p-type or an n-type dopant) or undoped. The substrate 200 may be a wafer, such as a silicon wafer. Generally, the SOI substrate is a layer of a semiconductor material formed on an insulator layer. The insulator layer is, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the substrate 100 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device region 202 is disposed on the substrate 200 in a front-end-of-line (FEOL) process. The device region 202 may include a wide variety of devices. In some embodiments, the devices include active components, passive components, or a combination thereof. In some other embodiments, the devices include integrated circuits devices. The devices are, for example, transistors, capacitors, resistors, diodes, photodiodes, fuse devices, or other similar devices. In an embodiment, the device region 202 includes a gate structure, source and drain regions, and isolation structures such as shallow trench isolation (STI) structures (not shown). In the device region 202, various N-type metal-oxide semiconductor (NMOS) and/or P-type metal-oxide semiconductor (PMOS) devices, such as transistors or memories and the like, may be formed and interconnected to perform one or more functions. Other devices, such as capacitors, resistors, diodes, photodiodes, fuses and the like may also be formed over the substrate 200. The functions of the devices may include memory, processors, sensors, amplifiers, power distribution, input/output circuitry, or the like.

As illustrated in FIG. 17, the first interconnect structure 210 is disposed on the device region 202, and the device region 202 is disposed between the substrate 200 and the first interconnect structure 210. In some embodiments, the first interconnect structure 210 includes a plurality of build-up layers (M1 to Mx−1, where x is a positive integer of 3 or greater; not labeled) formed with insulating layers and conductive layers. In detail, the first interconnect structure 210 at least includes insulating layers 211, 213, 215, 217, conductive vias 212, 216, and conductive layers 214, 218. The conductive via 212 is disposed on and electrically connected to the device region 202. The conductive layer 214 is disposed on and electrically connected to the conductive via 212. The insulating layers 211, 213 are collectively referred to as an IMD (inter-metal dielectric) layer laterally wrapping the conductive via 212 and the conductive layer 214 to constitute a build-up layer M1. On the other hand, the conductive layer 218 is disposed on and electrically connected to the conductive via 216. The insulating layers 215, 217 are collectively referred to as an IMD layer laterally wrapping the conductive via 216 and the conductive layer 218 to constitute another build-up layer Mx−1. As shown in FIG. 17, the build-up layer M1 (211, 212, 213 214) is electrically connected to the build-up layer Mx−1 (215, 216, 217, 218) through other build-up layer(s) (not shown), for example. Alternatively, the build-up layer M1 (211, 212, 213 214) may be electrically connected to the build-up layer Mx−1 (215, 216, 217, 218), directly.

As further illustrated in FIG. 17, the memory cell MC1 and the second interconnect structure 220 are stacked on the first interconnect structure 210 in order along the first direction D1 (build-up direction). The memory cell MC1 is electrically connected to the first interconnect structure 210 and the second interconnect structure 220. The second interconnect structure 220 may include an insulating layer 222B and a connection layer 222A. The insulating layer 222B is referred to as an IMD layer laterally wrapping the connection layer 222A to constitute a build-up layer (not labelled) or a part of a build-up layer. The insulating layer 222B is disposed on the memory cell MC1 to partially cover the top electrode 116'. The connection layer 222A is disposed in the insulating layer 222B to electrically connect to the selector 114' included in the memory cell MC1. Furthermore, the bottom electrode 104 of the memory cell MC1 is in contact and electrically connected to the conductive layer 218 of the first interconnect structure 210, and the top electrode 116' of the memory cell MC1 is in contact and electrically connected to the connection layer 222A of the second interconnect structure 220. The connection layer 222A may provide the voltage to the selector 114' for controlling the status of the memory cell MC1 (e.g. turning "on" or "off" the memory element 106'). On the other hand, the conductive layer 218 and the connection layer 222A may provide the voltages to the memory element 106' of the memory cell MC1 for operating the memory functions thereof. In other embodiments, one of the memory cells MC2, MC3, MC4 or MC5 are used to replace the memory cell MC1.

In some embodiments, the insulating layers 211, 213, 215, 217 and 222B are independently made of a dielectric material, such as silicon oxide, silicon nitride, silicon oxynitride, a spin-on dielectric material, or a low-k dielectric material. The conductive layers 214, 218 and the connection layer 222A each may be a conductive trace/line/wire. The conductive layers 214, 218, the connection layer 222A and the conductive vias 212, 216 may independently include metals or metal alloys including one or more of Al, AlCu, Cu, Ti, TiN, W, or the like. The conductive layers 214, 218 and the connection layer 222A are a portion of a current driving circuit (not shown) to provide voltages to the memory cell MC1. In some embodiments, the conductive vias 212, 216, and the conductive layers 214, 218 are formed by a dual damascene process. That is, the conductive vias 212, 216 and the conductive layers 214, 218 may be formed simultaneously. In some embodiments, the memory cell MC1 may be disposed between any two adjacent conductive layers in the back-end-of-line (BEOL) structure. In certain embodiments, the fabricating process of the memory cell MC1 may be compatible with the BEOL process of the semiconductor device, thereby simplifying process steps and efficiently improving the integration density.

Figure 18:
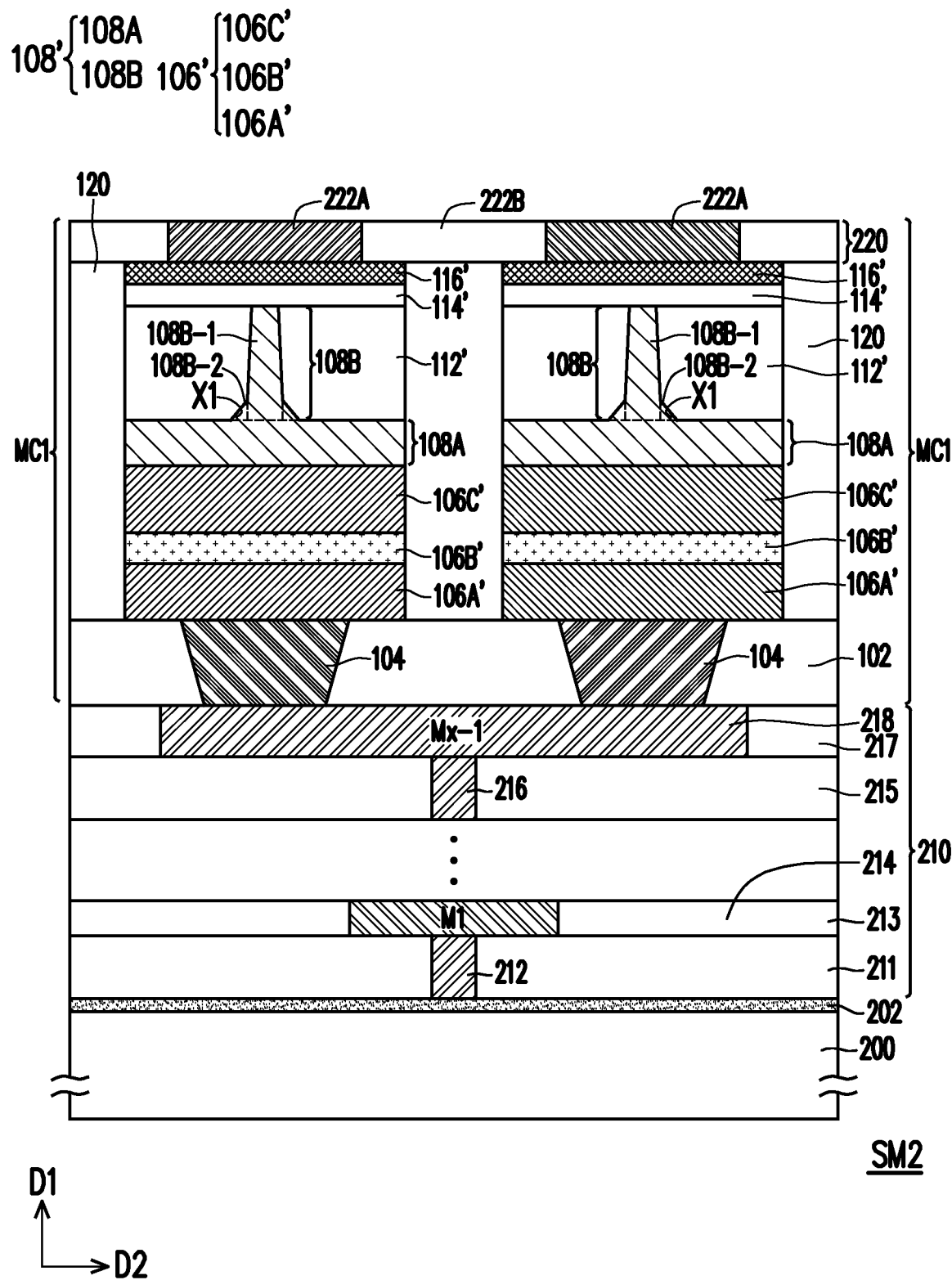
FIG. 18 is a schematic sectional view of a semiconductor device in accordance with some other embodiments of the present disclosure.

FIG. 18 is a schematic sectional view of a semiconductor device in accordance with some other embodiments of the present disclosure. The semiconductor device SM2 illustrated in FIG. 18 is similar to the semiconductor device SM1 illustrated in FIG. 17. Therefore, the same reference numerals are used to refer to the same or liked parts, and its detailed description will be omitted herein. The difference between the embodiments is that a plurality of memory cells MC1 is illustrated in the semiconductor device SM2 of FIG. 18. For example, as illustrated in FIG. 18, two memory cells MC1 are located in between the first interconnection structure 210 and the second interconnection structure 220. In some embodiments, the two memory cells MC1 are electrically coupled to one another through the first interconnection structure 210. The two memory cells MC1 may correspond to the memory cell MC1 illustrated in FIG. 12, thus its detailed description will be omitted herein.

Although two identical memory cells MC1 are illustrated herein, it is appreciated that two identical memory cells (e.g. MC1, MC2, MC3, MC4 or MC5) or two different memory cells (e.g. MC1, MC2, MC3, MC4 and MC5) may be included in the semiconductor device. For example, a semiconductor device may include a memory cell MC1 and a memory cell MC2; the semiconductor device may include a memory cell MC1 and a memory cell MC3; the semiconductor device may include a memory cell MC1 and a memory cell MC4; the semiconductor device may include a memory cell MC1 and a memory cell MC5; the semiconductor device may include a memory cell MC2 and a memory cell MC3; the semiconductor device may include a memory cell MC2 and a memory cell MC4; the semiconductor device may include a memory cell MC2 and a memory cell MC5; the semiconductor device may include a memory cell MC3 and a memory cell MC4; the semiconductor device may include a memory cell MC3 and a memory cell MC5; or the semiconductor device may include a memory cell MC4 and a memory cell MC5. Furthermore, the number of memory cells (MC1, MC2, MC3, MC4 and MC5) located in the memory region MR of the semiconductor device is not limited to one or two, but can be three or more. In case where a plurality of memory cells (MC1, MC2, MC3, MC4 and MC5) exist in the semiconductor device, the memory cells (MC1, MC2, MC3, MC4 and MC5) may be used alone (all the same type of memory cells), or be used in combination (different types of memory cells).

In the above-mentioned embodiments, in each of the memory cells, the pillar portion (or pillar foot) of the connecting structure is designed to have an included angle in a range of approximately 30 degrees to 60 degrees. The connecting structure is formed by a dual hard mask approach, which may help in controlling the patterning/etching process of the connecting structure, and one of the hard masks may act as a stop layer after a planarization (e.g. CMP) step. As such, the critical dimensions of the pillar portion of the connecting structure may be appropriately controlled, while a small but reliable contact area of the connecting structure to the selector is ensured. Furthermore, the connecting structure will have higher structural integrity and improved profile for providing the connection between the selector and the memory element. Overall, with such structural design and process control, a line break issue at memory cell boundaries, peeling or contact failure of the connecting structure may be avoided.

In accordance with some embodiments of the present disclosure, a memory cell includes a bottom electrode, a memory element, a selector, a top electrode and a connecting structure. The memory element is disposed on the bottom electrode. The selector is disposed on the memory element. The top electrode is disposed on the selector. The connecting structure is electrically connecting the memory element to the selector, wherein the connecting structure includes a base portion and a pillar portion. The base portion disposed on the memory element. The pillar portion is disposed on the base portion, wherein the pillar portion is physically connected to the selector, and includes a tapered pillar foot.

In accordance with some other embodiments of the present disclosure, a semiconductor device includes a first interconnect structure, at least one memory cell and a second interconnect structure. The first interconnect structure is disposed on a substrate. The at least one memory cell is disposed on the first interconnect structure, wherein the at least one memory cell includes a bottom electrode, a first memory element, a connecting structure, a selector and a top electrode. The bottom electrode is connected to the first interconnect structure. The first memory element is disposed on the bottom electrode. The connecting structure is disposed on the memory element, wherein the connecting structure includes a base portion and a pillar portion. The base portion is connected to the memory element, and the pillar portion is protruding out from the base portion, wherein a width of the pillar portion approximate to the base portion is wider than tops of the pillar portion away from the base portion. The selector is disposed on and connected to the pillar portion. The top electrode is disposed on the selector. The second interconnect structure is disposed on the at least one memory cell and electrically connected to the top electrode.

In accordance with yet another embodiment of the present disclosure, a method of forming a memory cell is described. The method includes the following steps. A bottom electrode is provided. A memory material stack is provided on the bottom electrode, and a connecting material is provided on the memory material stack. A first patterning process is performed on the connecting material to define a base portion and a pillar portion, wherein the pillar portion includes a tapered pillar foot. A selector material is formed on the connecting material. An electrode material is formed on the selector material. A second patterning process is performed to pattern the memory material stack, the connecting material, the selector material and the electrode material to respectively form a memory element, a connecting structure having the base portion and the pillar portion, a selector and a top electrode, wherein the connecting structure is electrically connecting the memory element to the selector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:
   a bottom electrode;
   a memory element disposed on the bottom electrode;
   a selector disposed on the memory element;
   a top electrode disposed on the selector; and
   a connecting structure electrically connecting the memory element to the selector, wherein the connecting structure comprises:
      a base portion disposed on the memory element, wherein sidewalls of the base portion are aligned with sidewalls of the memory element;
      a pillar portion disposed on the base portion, wherein the pillar portion is physically connected to the selector, and comprises a tapered pillar foot, and the pillar portion has an aspect ratio of 1:5 to 1:15.

2. The memory cell according to claim 1, wherein a width of the pillar portion decreases along a build-up direction.

3. The memory cell according to claim 1, wherein the tapered pillar foot has curved sidewalls.

4. The memory cell according to claim 1, wherein the pillar portion comprises:
   a pillar body disposed on the base portion; and
   the tapered pillar foot extending out from the pillar body and disposed on the base portion, wherein the tapered pillar foot has an included angle of 30 degrees to 60 degrees.

5. The memory cell according to claim 4, wherein a ratio of a width of the pillar body to a width of the tapered pillar foot is in a range of 1:1 to 4:1.

6. The memory cell according to claim 1, further comprising a dielectric layer disposed on the base portion and surrounding the pillar portion of the connecting structure, wherein a top surface of the dielectric layer is coplanar with a top surface of the pillar portion of the connecting structure.

7. The memory cell according to claim 1, wherein the selector comprises an ovonic threshold switch material.

8. The memory cell according to claim 1, wherein the base portion has a planar top surface, and the pillar portion is partially covering a first portion of the planar top surface while revealing a second portion of the planar top surface.

9. A semiconductor device, comprising:
   a first interconnect structure disposed on a substrate;
   at least one memory cell disposed on the first interconnect structure, wherein the at least one memory cell comprises:
      a bottom electrode connected to the first interconnect structure;
      a first memory element disposed on the bottom electrode;
      a connecting structure disposed on the first memory element, wherein the connecting structure comprises:
         a base portion connected to the first memory element, wherein sidewalls of the base portion are aligned with sidewalls of the first memory element; and
         a pillar portion protruding out from the base portion, wherein a width of the pillar portion approximate to the base portion is wider than tops of the pillar portion away from the base portion, and the pillar portion has an aspect ratio of 1:5 to 1:15;
      a selector disposed on and physically connected to the pillar portion; and
      a top electrode disposed on the selector; and
   a second interconnect structure disposed on the at least one memory cell and electrically connected to the top electrode.

10. The semiconductor device according to claim 9, wherein the pillar portion has curved sidewalls.

11. The semiconductor device according to claim 9, wherein the pillar portion comprises:
   a pillar body disposed on the base portion; and
   a pillar foot extending out from the pillar body and disposed on the base portion, wherein an included angle measured from a bottom surface of the pillar portion to a beveled surface of the pillar foot is in a range of 30 degrees to 60 degrees.

12. The semiconductor device according to claim 9, wherein the first memory element comprises:
   a first conductive layer disposed on the bottom electrode;
   a second conductive layer disposed on the first conductive layer and connected to the connecting structure; and
   a storage layer located in between the first conductive layer and the second conductive layer.

13. The semiconductor device according to claim 12, further comprising:
a second memory element disposed in between the first conductive layer of the first memory element and the bottom electrode.

14. The semiconductor device according to claim 9, further comprising a dielectric layer disposed on the base portion and surrounding the pillar portion of the connecting structure, wherein a top surface of the dielectric layer is coplanar with a top surface of the pillar portion of the connecting structure.

15. A method of forming a memory cell, comprising:
providing a bottom electrode;
providing a memory material stack on the bottom electrode, and a connecting material on the memory material stack;
performing a first patterning process on the connecting material to define a base portion and a pillar portion, wherein the pillar portion comprises a tapered pillar foot;
forming a selector material on the connecting material;
forming an electrode material on the selector material; and
performing a second patterning process to pattern the memory material stack, the connecting material, the selector material and the electrode material to respectively form a memory element, a connecting structure having the base portion and the pillar portion, a selector and a top electrode, wherein the connecting structure is electrically connecting the memory element to the selector, and the pillar portion is physically connected to the selector, and
wherein after the second patterning process, sidewalls of the base portion are aligned with sidewalls of the memory element, and the pillar portion has an aspect ratio of 1:5 to 1:15.

16. The method according to claim 15, wherein the first patterning process comprises:
providing a first mask layer over the connecting material and a second mask layer over the first mask layer;
providing a photoresist pattern over the second mask layer;
performing a first etching process to remove portions of the first mask layer and portions of the second mask layer;
removing the photoresist pattern;
performing a second etching process to remove portions of the connecting material to define the base portion and the pillar portion.

17. The method according to claim 16, further comprises:
forming a dielectric material on the base portion and surrounding the pillar portion of the connecting material after the first patterning process; and
performing the second patterning process to pattern the dielectric material along with the connecting material to form a dielectric layer and the connecting structure.

18. The method according to claim 17, wherein after the second patterning process, sidewalls of the dielectric layer are aligned with sidewalls of the selector and aligned with sidewalls of the base portion of the connecting structure.

19. The method according to claim 17, wherein the first patterning process removes the second mask layer while a portion of the first mask layer is retained, and the method further comprises:
performing a planarization process after the first patterning process to remove the first mask layer and portions of the dielectric material, wherein a top surface of the dielectric material is coplanar with a top surface of the pillar portion of the connecting material after the planarization process.

20. The method according to claim 15, wherein after the first patterning process, the pillar portion is formed with a pillar body and the tapered pillar foot, the pillar body is disposed on the base portion, and the tapered pillar foot is extending out from the pillar body and disposed on the base portion, wherein the tapered pillar foot has an included angle of 30 degrees to 60 degrees.

* * * * *